(12) United States Patent
Holloway et al.

(10) Patent No.: US 7,015,744 B1
(45) Date of Patent: Mar. 21, 2006

(54) SELF-REGULATING LOW CURRENT WATCHDOG CURRENT SOURCE

(75) Inventors: Peter R. Holloway, Groveland, MA (US); Jun Wan, Haverhill, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 83 days.

(21) Appl. No.: 10/860,473

(22) Filed: Jun. 2, 2004

Related U.S. Application Data

(60) Provisional application No. 60/534,445, filed on Jan. 5, 2004.

(51) Int. Cl.
*G05F 1/10* (2006.01)
(52) U.S. Cl. .................. 327/541; 327/543; 323/315
(58) Field of Classification Search ............... 327/538, 327/540, 541, 543; 323/312, 315
See application file for complete search history.

(56) References Cited

U.S. PATENT DOCUMENTS

| | | | | |
|---|---|---|---|---|
| 4,327,321 A | * | 4/1982 | Suzuki et al. ............... 323/315 |
| 5,359,296 A | * | 10/1994 | Brooks et al. ............... 330/288 |
| 5,512,855 A | * | 4/1996 | Kimura ....................... 327/538 |
| 5,559,425 A | * | 9/1996 | Allman ........................ 323/315 |
| 5,801,523 A | * | 9/1998 | Bynum ........................ 323/315 |
| 5,886,571 A | * | 3/1999 | Suwabe ....................... 327/541 |
| 6,002,245 A | * | 12/1999 | Sauer .......................... 323/315 |
| 6,496,057 B1 | * | 12/2002 | Wada et al. ................. 327/543 |
| 6,528,980 B1 | | 3/2003 | Smith |
| 6,737,908 B1 | * | 5/2004 | Mottola et al. ............. 327/539 |
| 2001/0010478 A1 | * | 8/2001 | Shih et al. ................... 327/539 |

\* cited by examiner

*Primary Examiner*—Terry D. Cunningham
(74) *Attorney, Agent, or Firm*—Patent Law Group LLP; Carmen C. Cook

(57) ABSTRACT

A self-regulating current source is formed by a PMOS current mirror and an interconnected pair of NMOS transistors. The NMOS transistors are sized differently and forced to operate at similar currents. The difference of the Vgs voltages of the NMOS transistors is impressed across the resistor to develop a stable output current. In particular, the current source starts reliably at low supply voltages and operates to reliably generate a stable low output current at a well-controlled operating point. The self-regulating current source can be used effectively as the watchdog current source of a power-on reset circuit to ensure reliable and robust operation even at low Vdd voltage values.

10 Claims, 21 Drawing Sheets

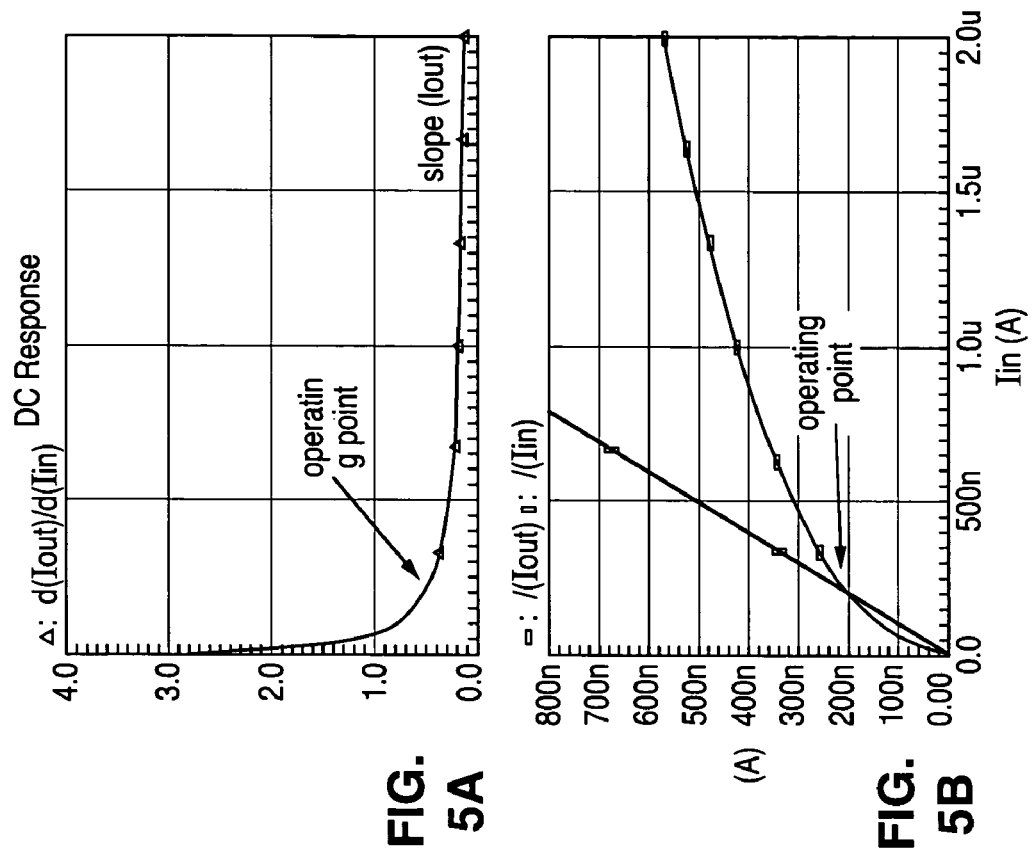
FIG. 5A
FIG. 5B
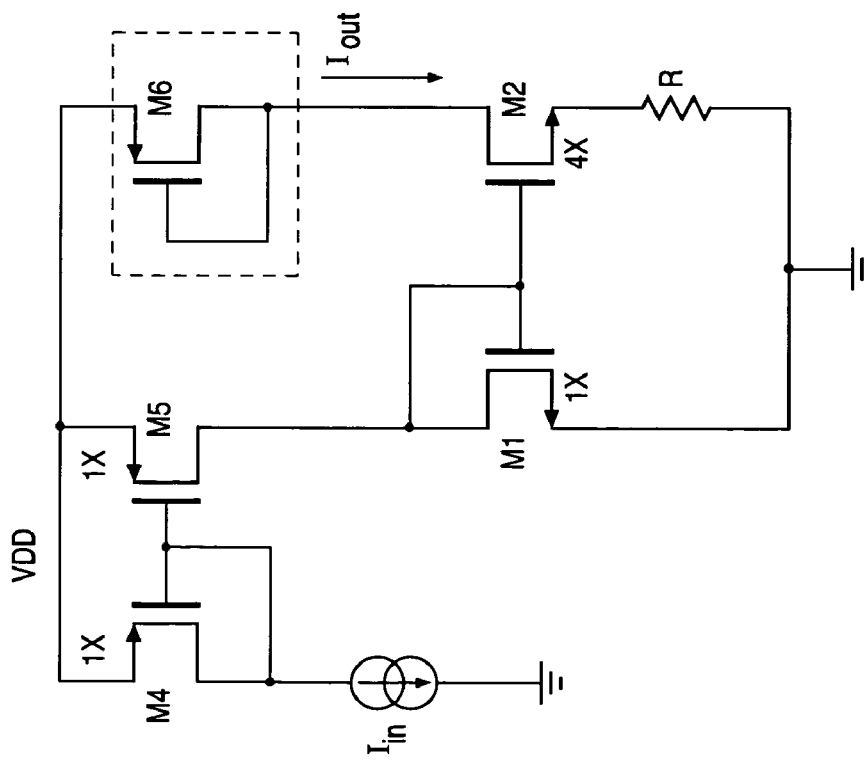
FIG. 4 (PRIOR ART)

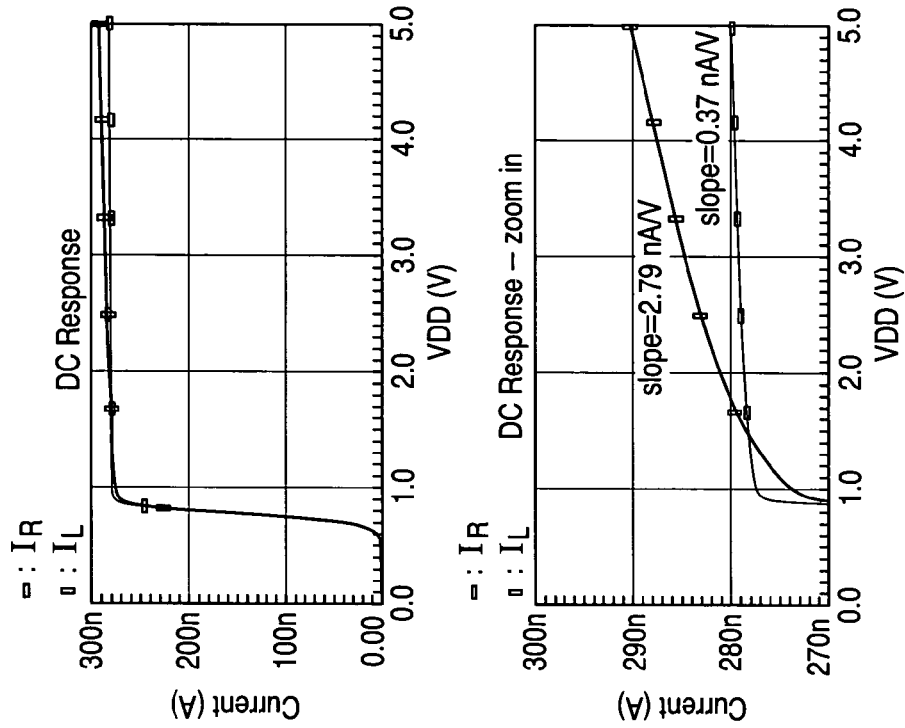
FIG. 7A
FIG. 7B
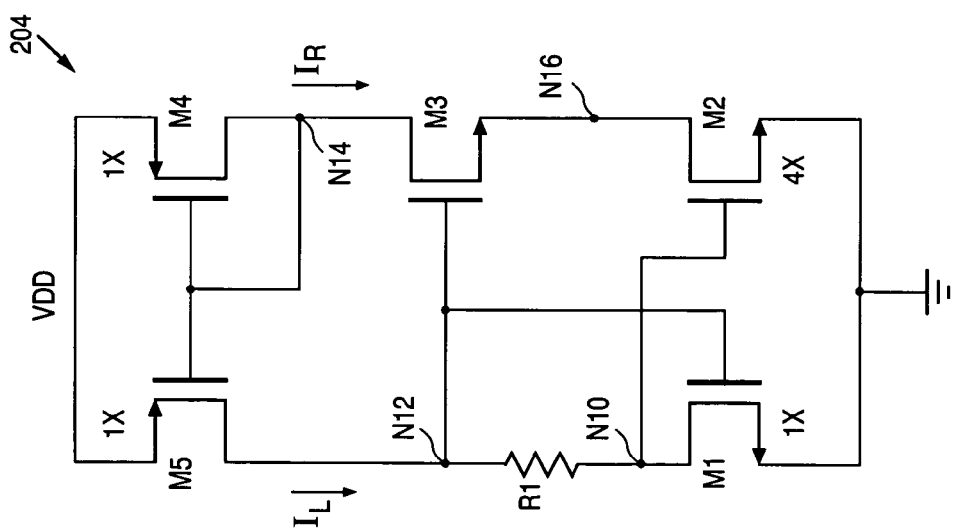
FIG. 6

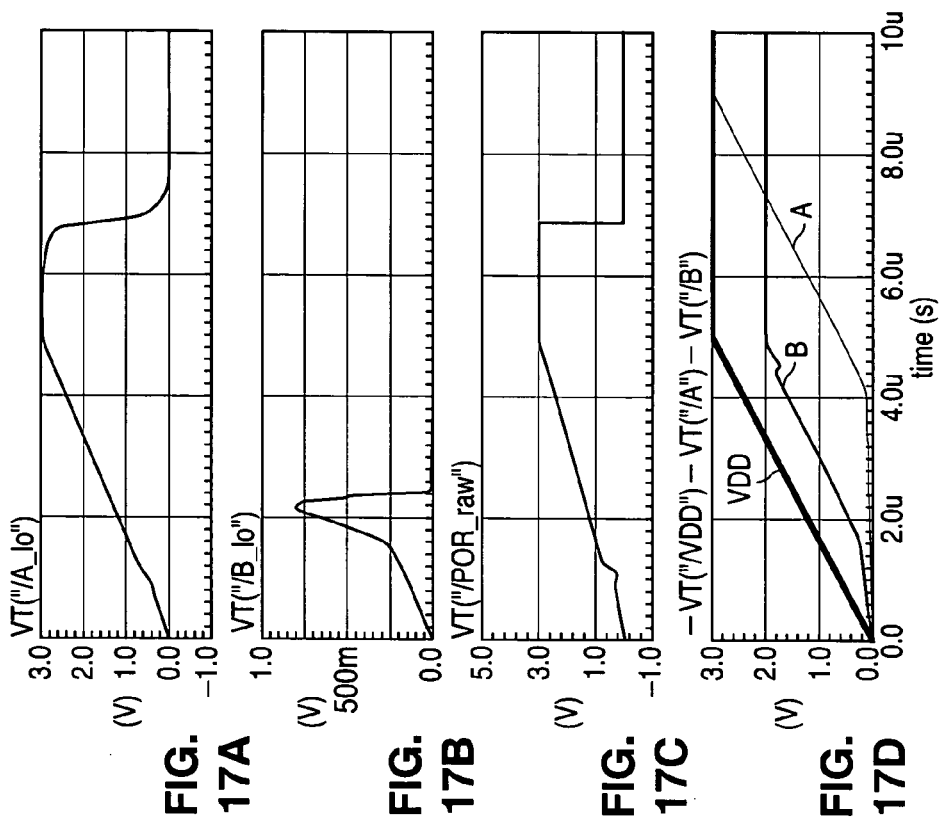
FIG. 17A
FIG. 17B
FIG. 17C
FIG. 17D
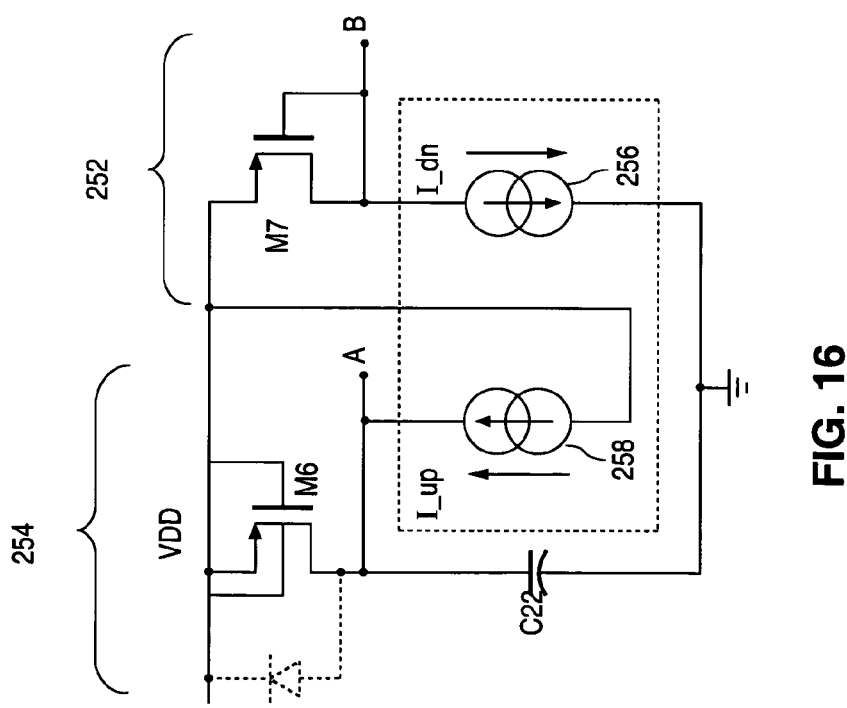
FIG. 16

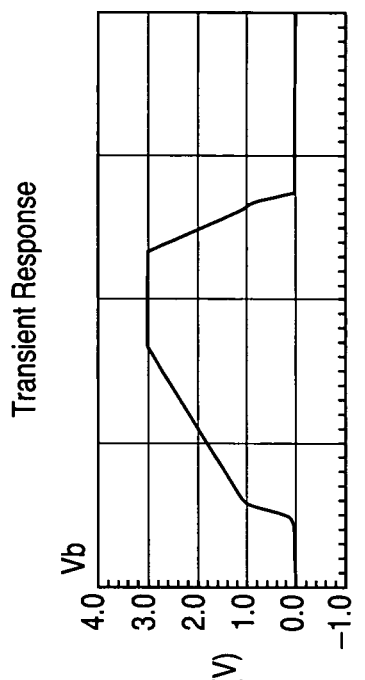
FIG. 23D
FIG. 23E
FIG. 23F
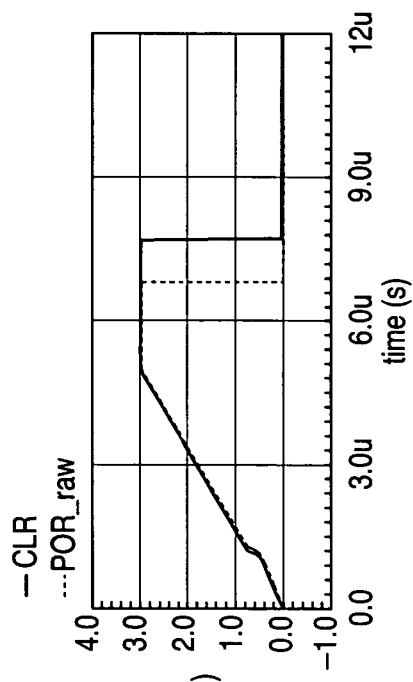
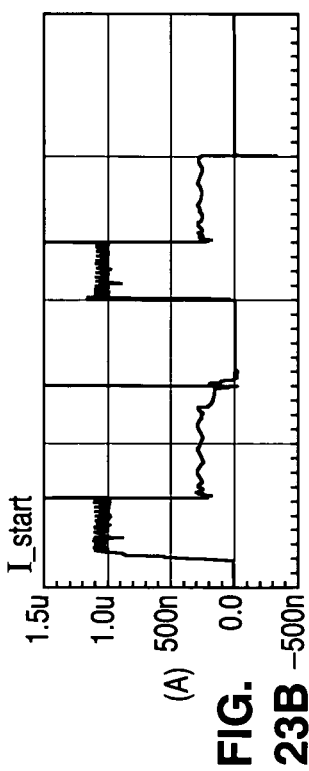
FIG. 23A
FIG. 23B
FIG. 23C
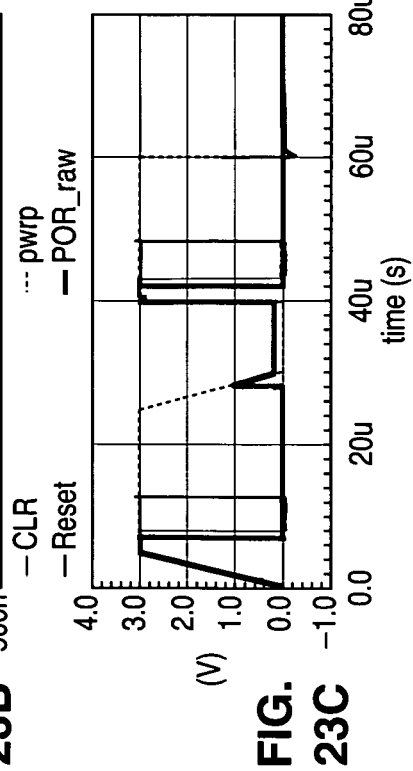

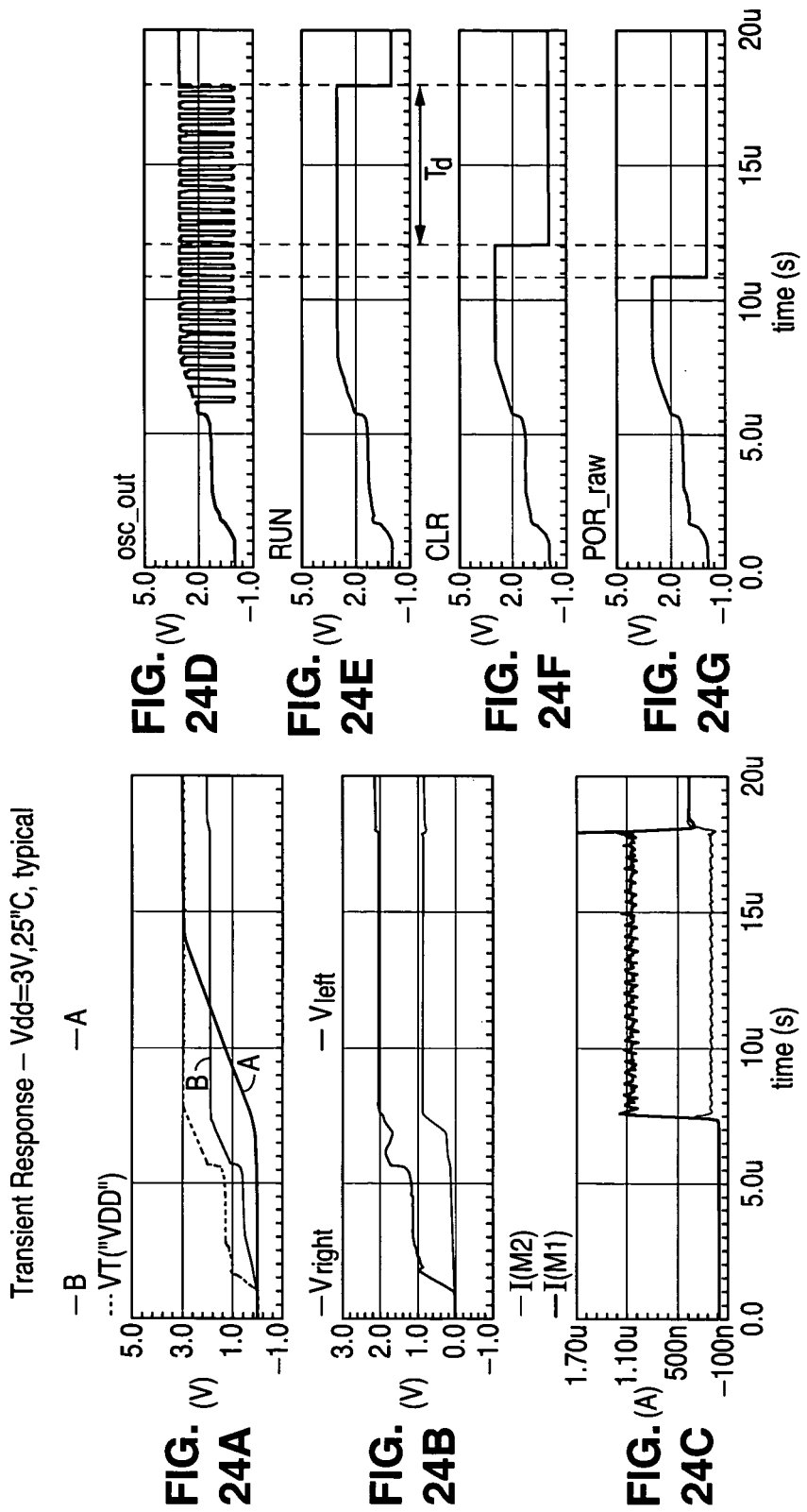

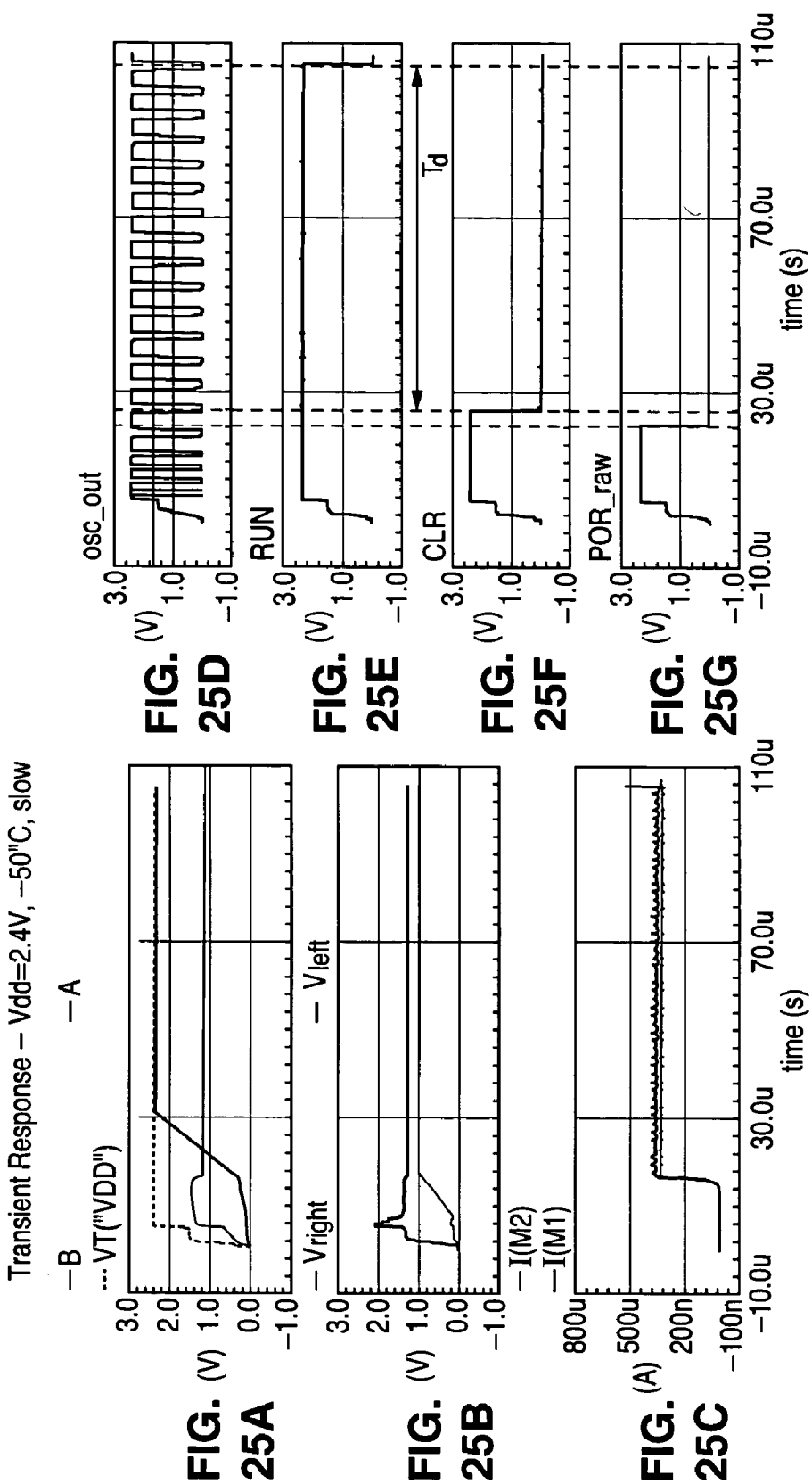

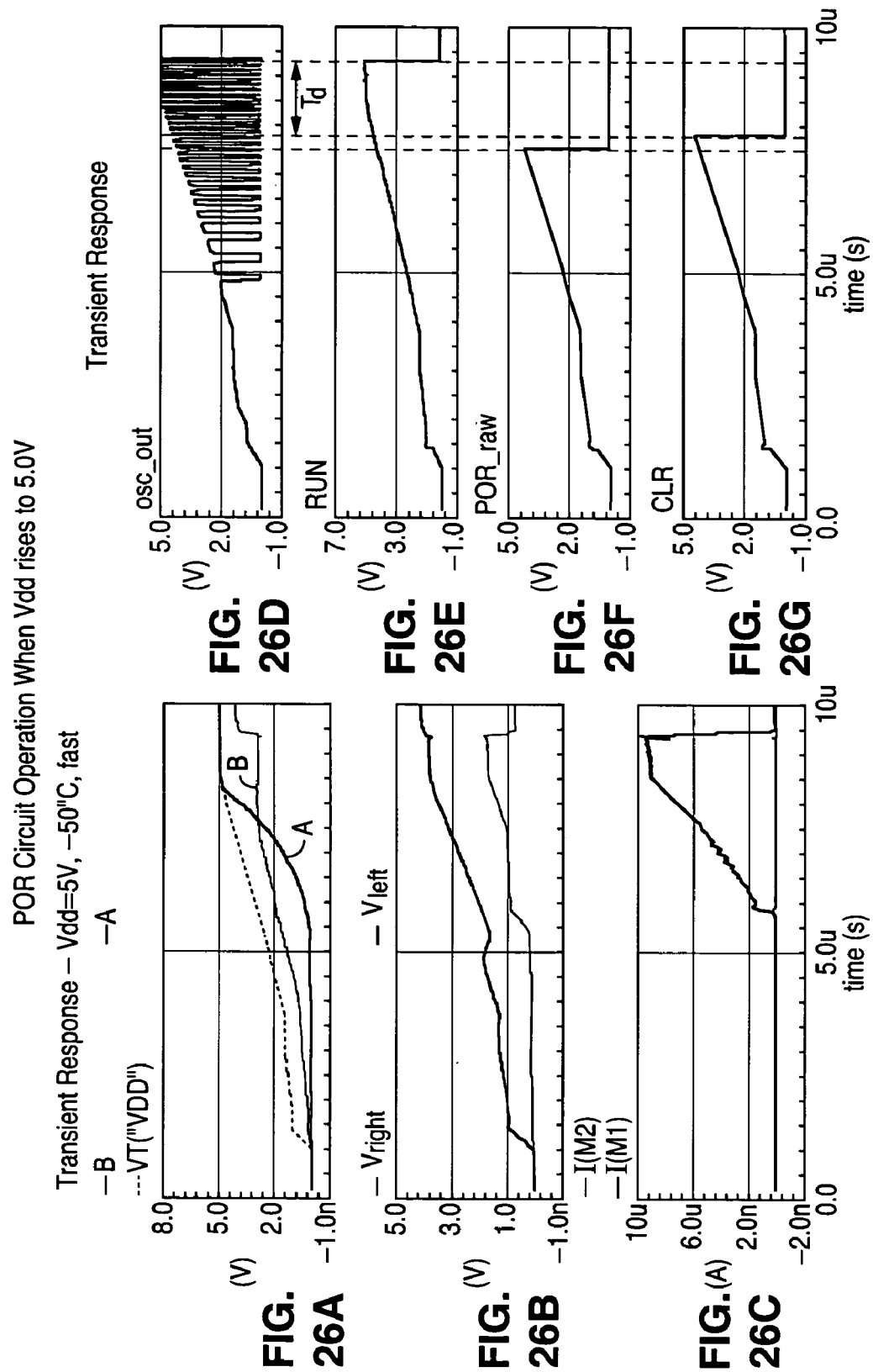

SELF-REGULATING LOW CURRENT WATCHDOG CURRENT SOURCE

CROSS-REFERENCE TO RELATED APPLICATION

This application claims the benefit of U.S. Provisional Patent Application Ser. No. 60/534,445, filed on Jan. 5, 2004, having the same inventorship hereof, which application is incorporated herein by reference in its entirety.

This application is related to concurrently filed and commonly assigned U.S. patent application Ser. No. 10/860,423, entitled "Power-On Reset Circuit with Low Standby Current and Self-adaptive Reset Pulse Width," of P. Holloway et al., which application is incorporated herein by reference in its entirety.

FIELD OF THE INVENTION

The invention relates to a current source and, in particular, to a self-regulating low current watchdog current source.

BRIEF DESCRIPTION OF THE DRAWINGS

FIG. 4 is a circuit diagram of a conventional self-regulating current source with its negative feedback loop disabled for the purpose of measuring load line current.

FIG. 5, including FIGS. 5A and 5B, contains waveforms illustrating the operation of the current source of FIG. 4.

FIG. 6 is a circuit diagram of a self-regulating current source with its feedback loop enabled according to one embodiment of the present invention.

FIG. 7, including FIGS. 7A and 7B, contains waveforms illustrating the operation of the current source of FIG. 6.

FIG. 16 is a circuit diagram illustrating one implementation of the AC level detect circuit and the DC level detect circuit of the Vdd threshold detect circuit.

FIG. 17, including FIGS. 17A, 17B, 17C and 17D, contains waveforms illustrating the operation of the vdd threshold detect circuit of FIG. 15 for a positive going Vdd voltage.

FIG. 23, including FIGS. 23A to 23F, contains waveforms illustrating the operation of the POR circuit of the present invention when different Vdd vectors are being presented to the POR circuit.

FIG. 24, including FIGS. 24A to 24G, contains waveforms illustrating the operation of the POR circuit of the present invention when Vdd rises to 3V at a typical process corner and a temperature of 25° C.

FIG. 25, including FIGS. 25A to 25G, contains waveforms illustrating the operation of the POR circuit of the present invention when Vdd rises to 2.4V at a slow process corner and a temperature of –50° C.

FIG. 26, including FIGS. 26A to 26G, contains waveforms illustrating the operation of the POR circuit of the present invention when Vdd rises to 5V at a fast process corner and a temperature of –50° C.

DETAILED DESCRIPTION OF THE PREFERRED EMBODIMENTS

Figure 1:
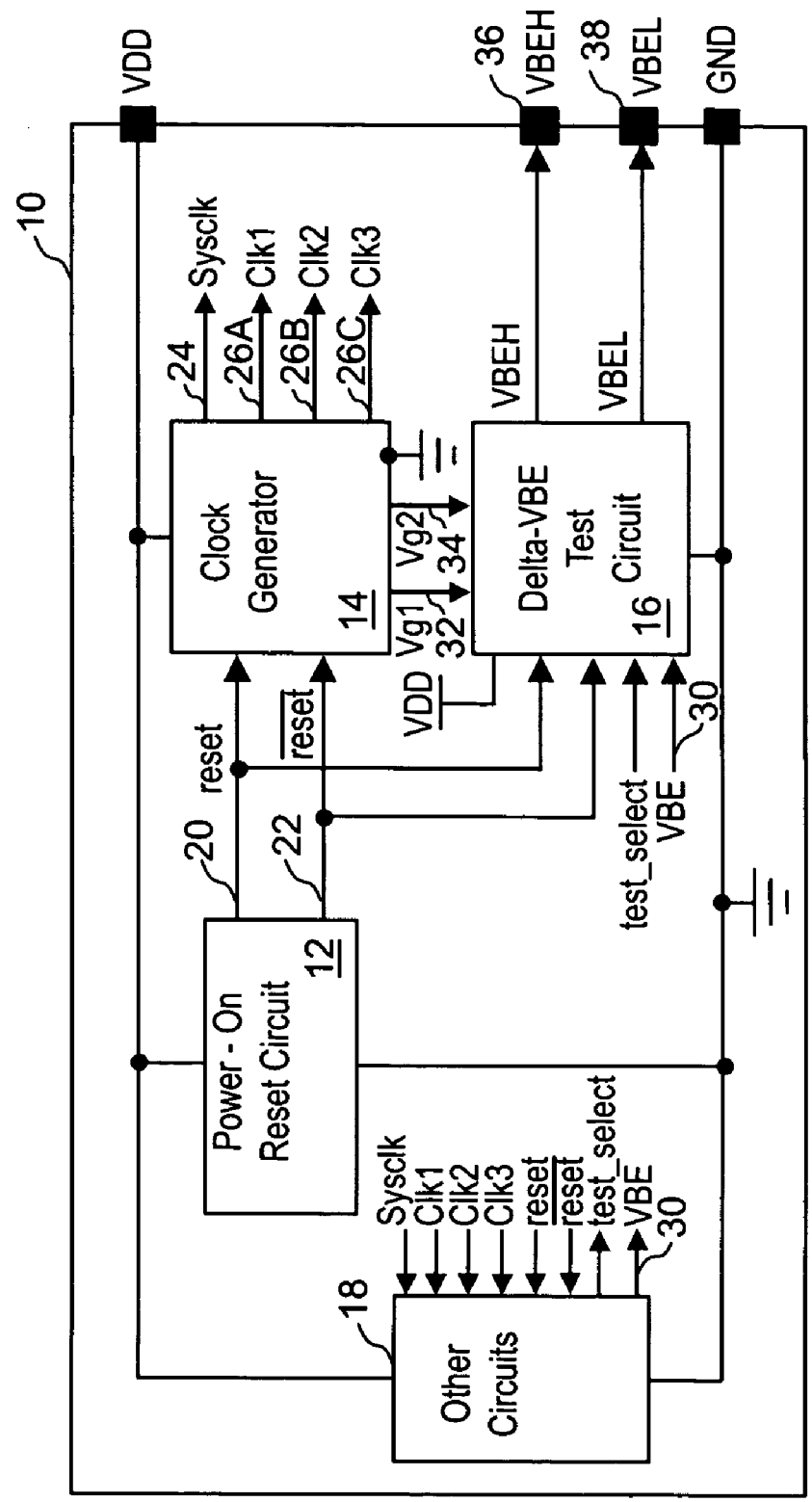
FIG. 1 is a schematic diagram of a digitizing temperature sensor system in which the power-on reset (POR) circuit of the present invention can be incorporated.

In accordance with the present invention, a power-on reset (POR) circuit providing reliable POR functionality over almost the entire range of Vdd events is disclosed. The POR circuit includes a Vdd threshold detector capable of both "DC" and "AC" Vdd edge detection, a self-regulating current source biasing the Vdd threshold detector, a gated ring oscillator providing a boost current for the self-regulating current source, and a DC biasing start-up circuit providing start-up currents for a DC biasing generator. The POR system provides a highly reliable means to guarantee that the DC biasing generator always starts upon power up. The POR circuit merges accurate detection of the full range of Vdd events with a self-adapting circuit that adjusts its own start-up behavior in accordance with the actual on-chip variations in Vdd-dependent logic thresholds that occur over process, time, temperature and Vdd. In addition, the POR circuit employs several "pulse-stretching" techniques operating independently but mutually working together to create a POR assertion persistence in the time domain that further enhances the reliability of POR signal effectiveness.

The POR circuit of the present invention offers many advantages and improvements over conventional POR circuits. First, the POR circuit of the present invention is effective in detecting a wide range of Vdd events. Second, the POR circuit utilizes self-adaptive pulse-stretching techniques to ensure that the Power-On Reset signal persists for a sufficient amount of time after the expiration of the Vdd event so that all logic and analog circuits can be properly reset. Lastly and importantly, when the POR circuit of the present invention is implemented using a self-regulating watchdog current source in accordance with the present invention, reliable and robust operation over process, time, temperature and Vdd variations can be ensured.

According to another aspect of the present invention, a self-regulating current source is formed by a PMOS current mirror and an interconnected pair of NMOS transistors. The NMOS transistors are sized differently and forced to operate at similar currents. The difference of the Vgs voltages of the NMOS transistors is impressed across the resistor to develop a stable output current. In particular, the current source starts reliably at low supply voltages and operates to reliably generate a stable low output current at a well-controlled operating point. The self-regulating current source can be used effectively as the watchdog current source of the POR circuit to ensure reliable and robust operation even at low Vdd voltage values.

Vdd Events

An integrated circuit is typically powered by one or more Vdd power supply voltages, also called Vdd rails. To ensure proper circuit operation, it is generally desirable that the Vdd power supply voltage remains constant and stable when the integrated circuit is powered on. However, in actual operation, the Vdd voltage often varies due to factors outside the control of the integrated circuit. Such Vdd voltage variations are often referred to as "Vdd events."

"Vdd events" that are potentially damaging to normal circuit operations include a myriad of possible voltage signatures, varying in down slew rate, depth of notch, up slew rate, and extremely slow or near DC variations in magnitude for each portion of an identifiable excursion on the Vdd rail. In the present description, the different excursions of Vdd events will be referred to as Vdd vectors. Naturally, a single vdd vector alone can have a nearly infinite set of possible quantifiable characteristics. In the present description, an AC Vdd edge or an AC Vdd vector refers to a narrow glitch or fast swing voltage on the power supply. On the other hand, a DC Vdd edge or a DC Vdd vector refers to slow changes on the Vdd supply voltage that brings the Vdd down to a non-operative level.

Both analog and digital CMOS circuitry in an integrated circuit can be affected by low voltage Vdd brownouts or Vdd glitches. When a critical minimum operating voltage threshold is not continuously maintained but interrupted in some way, the functional state of an integrated circuit can, and likely, will be negatively altered and remain in a state of either non-functionality or seriously altered parametric condition.

Therefore, every robust integrated circuit needs special circuitry to detect Vdd events that are potentially damaging to normal operation. Typically, a Power-On Reset (POR) circuit is incorporated in an integrated circuit for detecting and responding to Vdd events. When a Vdd event is "detected," a POR (Power-On Reset) signal is set true. Since, by definition, this occurs when the Vdd voltage is too low in value for reliable operation of logic and/or analog circuitry, a very important needed feature of a POR circuit is that the POR value "remains" true as the Vdd voltage recovers until a Vdd voltage is reached that is guaranteed to be high enough in value as to allow reliable propagation of the POR signal to every and all circuits on the integrated circuit that must be re-initialized.

POR circuits for addressing the power-on reset problem are well known in CMOS designs. However, many of the conventional POR circuits are not satisfactory. Specifically, the conventional solutions to the POR problems can be characterized as working over most of the possible Vdd events, but not all of the possible Vdd events or sequences. A robust POR circuit must be capable of detecting many different types of Vdd events and propagating a reliable POR signal in response thereto. A POR signal is reliable when, after a Vdd event is detected, the POR signal is guaranteed to be true in both the time and the voltage domain long past the point where all the circuits are guaranteed to receive the POR signal and accomplish the reset task.

When the Vdd rail is subjected to more than one Vdd vector over time, the history of each vector can, and usually does, interact with the response of any given POR circuit to the succeeding vector. For these reasons, conventional POR circuits can only be said to realize reliable operation in some of the Vdd event combinations but not all of the Vdd event combinations. However, it is desirable to provide a POR circuit that broadens the capability of reliable POR detection and propagation, regardless of the type of or the multiplicity of all Vdd events.

Power-On Reset Circuit Overview

FIG. 1 is a schematic diagram of a digitizing temperature sensor system in which the power-on reset (POR) circuit of the present invention can be incorporated. In the present illustration, the power-on reset circuit of the present invention is incorporated in a digitizing temperature sensor system 10 for providing power-on reset function to the digitizing temperature sensor system. Referring to FIG. 1, digitizing temperature sensor system 10 is built as an integrated circuit and a power-on reset circuit 12 is incorporated for monitoring the status of the power supply voltage Vdd. Digitizing temperature sensor system 10 includes a temperature sensing element, such as a diode, built into the integrated circuit for providing temperature measurements. In the present illustration, the temperature sensing diode is included in a circuit block 18 and a terminal 30 on circuit block 18 provides the VBE voltage of the temperature sensing diode. Digitizing temperature sensor system 10 also includes a clock generator circuit 14 and a delta-VBE test circuit 16. Delta-VBE test circuit 16 is included for synchronously sampling the VBE voltage so as to measure the delta-VBE ($\Delta V_{BE}$) voltage of the on-chip diode. The delta-VBE voltage can then be used to calculate the chip temperature of the integrated circuit. In digitizing temperature sensor system 10, power-on reset circuit 12 monitors the Vdd voltage to detect Vdd conditions that may require resetting of the analog and digital circuitry on the integrated circuit. Power-on reset circuit 12 generates a reset signal and its complement reset_inverse signal which are provided to circuit block 18, clock generator 14, and delta-VBE test circuit 16 to control the reset operation of the circuit blocks.

FIG. 1 is illustrative of one application in which the power-on reset circuit of the present invention can be incorporated. In practice, the power-on reset circuit of the present invention can be incorporated in any integrated circuit, including but not limited to a digitizing temperature sensor system, for providing the power-on reset function. The power-on reset circuit of the present invention is basically a stand-alone circuit block coupled to the Vdd voltage and providing a power-on reset signal which power-on reset signal can be connected to any desired circuitry of an integrated circuit to implement the necessary power-on reset function.

Figure 2:
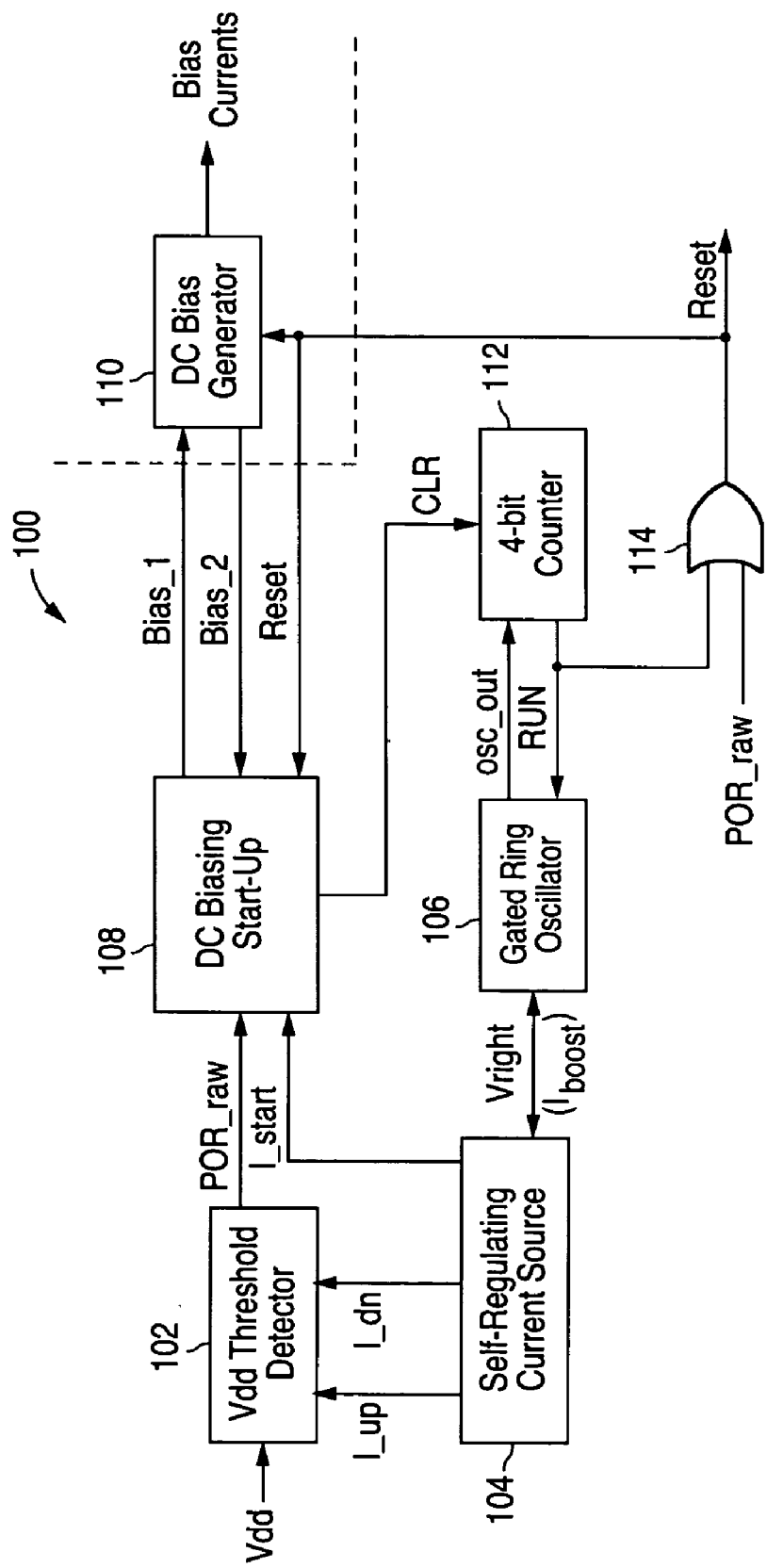
FIG. 2 is a block diagram of a power-on reset (POR) circuit according to one embodiment of the present invention.

FIG. 2 is a block diagram of a power-on reset (POR) circuit according to one embodiment of the present invention. Referring to FIG. 2, a POR circuit 100 includes an accurate Vdd threshold detector 102. Vdd threshold detector 102 is connected to the Vdd supply voltage to be monitored and is capable of detecting DC edges and AC edges in the Vdd supply voltage. In operation, Vdd threshold detector 102 detects any abnormality in the Vdd voltage and asserts a POR_raw signal. Once the POR_raw is asserted, the power-on reset signal of POR circuit 100, denoted as the "Reset" signal in FIG. 2, is also asserted. In fact, the operation of POR circuit 100 will cause the reset signal, once asserted, to persist past the point where the Vdd voltage has recovered to a level such that the analog and digital circuitry are guaranteed to work again.

In POR circuit 100, Vdd threshold detector 102 is biased by a self-regulating current source 104 coupled to a gated ring oscillator 106. Self-regulating current source 104 provides output currents I_up and I_dn to Vdd threshold detector 102. Self-regulating current source 104 utilizes the ring oscillator's supply current as a start up boost current. Specifically, the supply voltage Vright of gated ring oscillator 106 is coupled to self-regulating current source 104 to provide a current Iboost for aiding in the start-up of the current source. Gated ring oscillator 106 turns on at a very low Vdd voltage value, such as about 1.4 volts, so that current Iboost can be provided to current source 104 at very low Vdd voltages. Thus, self-regulating current source 104 can start up and provide currents I_up and I_dn to Vdd threshold detector 102 at low Vdd voltages.

Gated ring oscillator 106 is controlled by a RUN signal generated by a counter circuit 112 and provides an oscillator output (osc_out) as a clock signal to the counter circuit. When a Vdd event occurs, the RUN signal is asserted. After the Vdd voltage has recovered sufficiently from the Vdd event, such as about 1.4V, gated ring oscillator 106 starts to oscillate and provide the clock signal osc_out to counter 112. After CLR is deasserted, counter circuit 112 is enabled and starts to count its programmed number of clock cycles. The RUN signal is thereby continuously asserted for the predetermined number of clock cycles determined by the count of counter circuit 112. When counter circuit 112 completes its count, the RUN signal is deasserted to turn off gated ring oscillator 106. The time duration associated with the predetermined number of clock cycles is denoted as a time "Td" in the present description. The number of clock cycles is determined by the implementation of counter circuit 112. In the embodiment shown in FIG. 2, counter circuit 112 is a 4-bit counter. Thus, counter circuit 112 is programmed to count for 16 cycles when enabled. The time Td is thus 16 clock cycles in the present embodiment. When counter circuit 112 finishes its count, the RUN signal is deasserted to turn off gated ring oscillator 106.

POR circuit 100 further includes a DC biasing start-up circuit 108 for providing a start-up current (Bias_1) to DC bias generator 110. DC biasing start-up circuit 108 receives the POR_raw signal, an I_start current from self-regulating current source 104 as input signals. DC biasing start-up also receives the reset signal and a feedback current (Bias_2) from DC bias generator 110. The DC biasing start-up circuit produces a CLR signal for counter circuit 112 and the start-up current Bias_1 for DC bias generator 110. DC biasing start-up circuit 108 provides a highly reliable means to guarantee that DC bias generator 110 always starts after reset is deasserted as long as current I_start is driving the DC biasing start-up circuit. DC bias generator 110 provides the bias currents for the integrated circuit in which POR circuit 100 is incorporated. DC bias generator 110 also receives the reset signal as an input signal and is initialized until the reset signal is released.

In POR circuit 100, the power-on reset signal—"Reset" signal—is the logical OR of the POR_raw signal and the RUN signal. Because an OR gate 114 receives the POR_raw signal and the RUN signal as input signals and performs the logical OR operation, it generates the reset signal. The reset signal can then be used by the digital and analog circuitry on the integrated circuit in which the POR circuit is incorporated to initiate reset operations.

Power-On Reset Circuit Operation Overview

Figure 3:
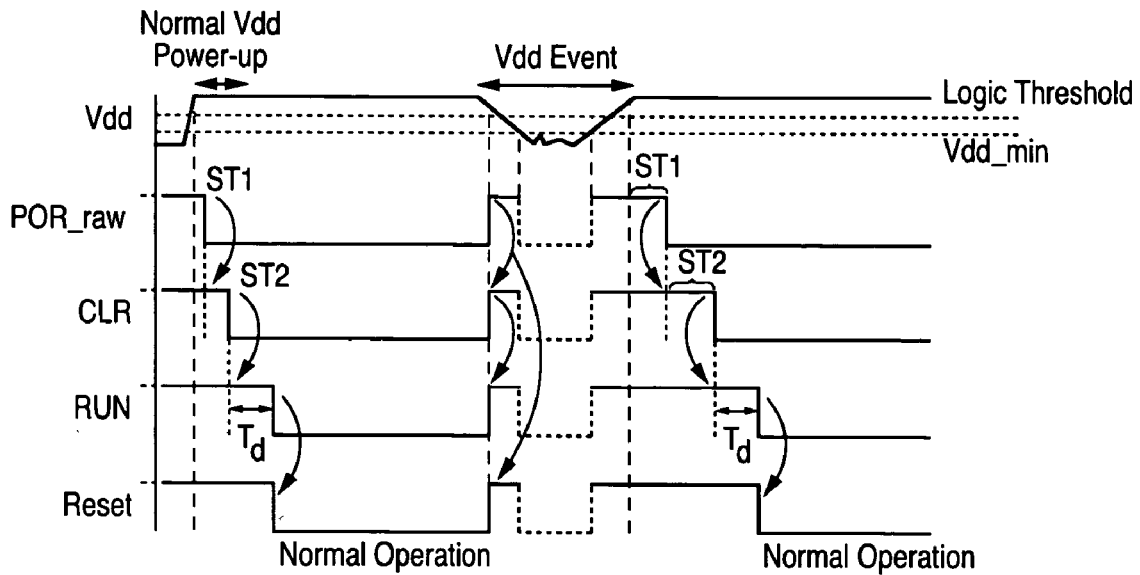
FIG. 3 is a timing diagram illustrating the operation of the power-on reset circuit of the present invention in response to a Vdd event.

The operation of POR circuit 100 will now be described with reference to the timing diagram of FIG. 3. FIG. 3 is a timing diagram illustrating the operation of the power-on reset circuit of the present invention in response to a Vdd event. FIG. 3 is intended to represent pictorially the sequence of events occurring during the operation of the power-on reset circuit of the present invention in response to a Vdd event. The signal waveforms in FIG. 3 are not drawn to scale both in the vertical axis (voltage magnitude) and in the horizontal axis (time). The vertical axis of the signal waveforms in FIG. 3 does not represent actual or relative voltage levels but rather should be interpreted as representing the logical states of the respective signal. Simulation results illustrating the operation of the POR circuit of the present invention under various Vdd voltage conditions are included in FIGS. 23–26 and will be described in more detail below.

First, it is assumed that the integrated circuit on which POR circuit 100 is incorporated has been powered off and is being powered on during a normal Vdd power-on operation where the Vdd voltage increases from a power-off state (e.g. 0 volt) to a power-on state. As the Vdd voltage starts to increase, gated ring oscillator 106 starts to oscillate as the gated ring oscillator can operate at very low Vdd voltages. In one embodiment, gated ring oscillator 106 can start at a Vdd voltage as low as 1.4 volts. Gated ring oscillator 106 provides a current Iboost to self-regulating current source 104 to start up the current source. Specifically, gated ring oscillator 106 draws current from self-regulating current source 104 in such a way as to temporarily magnify the leakage based currents that are then regeneratively amplified and brought into the Vdd independent constant output currents I_up and I_dn. Currents I_up and I_dn are used for precisely biasing Vdd threshold detector 102 so that the initial diode voltage drops and capacitor slew rates of the detector are set to ideal values. Once Vdd threshold detector 102 is started up, the POR_raw signal is asserted (active high) until the Vdd voltage has reached a predetermined voltage level, such as the logic threshold of the integrated circuit.

Self-regulating current source 104 also provides an I_start current to DC biasing start-up circuit 108. Once the DC biasing start-up circuit has started up, the circuit generates a CLR signal (active high) to clear counter circuit 112. The CLR signal clears the count in counter circuit 112 and as long as the CLR signal is asserted (active high), counter circuit 112 is cleared and does not count. When counter circuit 112 is cleared, the circuit also generates a RUN signal (active high) which is coupled to gated ring oscillator 106 to allow the oscillator circuit to continue oscillating. Meanwhile, DC biasing start-up circuit 108 is ready to provide the start-up current Bias_1 to DC bias generator 110 as soon as the reset signal is deasserted.

As the Vdd voltage increases past a predetermined threshold point, the POR_raw signal is deasserted. As will be described in more detail below, Vdd threshold detector 102 implements a pulse stretching technique where by the deasserting of the POR_raw signal is extended to ultimately increase the persistence of the reset signal.

After the POR_raw signal is deasserted, DC biasing start-up circuit deasserts the CLR signal. The deassertion of the CLR signal is also subject to pulse stretching so that the deassertion of the CLR signal is delayed from the deassertion of the POR_raw signal. When the CLR signal is deasserted, counter circuit 112 is allowed to run its preprogrammed number of clock cycles. The clock pulse width is determined by gated ring oscillator 106. The clock pulse width of the gated ring oscillator can be self adjusted to compensate for supply voltage, operating temperature, fabrication process variance to make sure the reset pulse width adjusts itself to meet the timing and voltage needs of all digital circuits at every specific condition influenced by the above mentioned variables. When the maximum number of count is reached, counter circuit 112 deasserts the RUN signal. The delayed deassertion of the RUN signal relative to the deassertion of the CLR signal represents another pulse stretching technique implemented to increase the persistence of the reset signal.

When the RUN signal is deasserted, the reset signal is finally deasserted to allow the integrated circuit to start normal operation. The deassertion of the reset signal turns on a portion of DC biasing start-up circuit 108 to provide a startup current (Bias_1) to DC bias generator 110. The startup current remains active in a standby mode. If, for example, DC bias generator 110 turns off for any reason at all, the feedback current (Bias_2) goes to a zero value. This allows DC biasing start-up circuit 108 to provide again startup current Bias_1 to DC biasing generator 110, thus providing a reliable re-start mechanism to DC bias generator 110 that handles all contingencies. The time when the reset signal is asserted is more than sufficient to allow the digital and/or analog circuitry on the integrated circuit to complete their reset operation to put the integrated circuit in the desired operation state.

When the RUN signal is deasserted, the gated ring oscillator is turned off and the self-regulating current source no longer has a boost current. The self-regulating current source is then allowed to reach a precise equilibrium operating condition. Having the self-regulating current source operating in its equilibrium condition enables a high level of both precision and repeatability for the Vdd threshold detector that generates the POR_raw signal.

When a Vdd event occurs, Vdd threshold detector 102 detects the undesirable Vdd condition and asserts the POR_raw signal (active high). The assertion of the POR_raw signal causes DC biasing start-up circuit to assert the CLR signal (active high) and causes OR gate 114 of FIG. 2 to assert the reset signal, regardless of the state of the RUN signal. The CLR signal coupled to counter circuit 112 causes the counter to clear. That is, the counter has a value of "0000". The counter circuit then asserts the RUN signal (active high). Gated ring oscillator 106 is then enabled to oscillate. With the assertion of the reset signal, the integrated circuit is in reset.

Because gated ring oscillator 106 can operate at very low Vdd voltages, the ring oscillator can supply an Iboost current to self-regulating current source 104 at very low Vdd voltages so that the current source can reliably generate currents I_up and I_dn for biasing Vdd threshold detector 102. The self-regulating current source is a watchdog current source as the self-regulating current source will remain on once it is turned on unless and until the Vdd voltage falls below the minimum operative voltage which is about 0.8 volts. In this manner, Vdd threshold detector 102 is properly biased even at very low Vdd voltages and is operative to detect changing Vdd conditions.

During a Vdd event, the Vdd voltage may suffer from a glitch and dip below the required voltage level for only a very brief period of time. As long as the Vdd voltage remains above the Vdd_min voltage, such as 0.8 volts, the self-regulating current source 104 will continue to operate to provide the bias currents to Vdd threshold detector 102. If the Vdd voltage drops below the Vdd_min voltage level, such as about 0.8 volts, all circuit blocks in POR circuit 100 will also shut down. However, if this happens, the POR circuit 100 operates as if Vdd were starting from zero volts, and generates an entire new power-on reset sequence as described heretofore, beginning with the assertion of POR_raw.

As the Vdd voltage recovers from the Vdd event, the Vdd voltage increases until the voltage passes a threshold value. When Vdd threshold detector 102 detects that the Vdd voltage has reached the desired level, such as the logic threshold, Vdd threshold detector 102 will deassert the POR_raw signal. As mentioned above, Vdd threshold detector 102 implements a pulse stretching technique whereby the time period between the detection of a favorable Vdd condition and the deassertion of the POR_raw signal is extended. This extended time period is denoted as ST1 in FIG. 3. In the present description, a Vdd event is deemed to have expired when the vdd voltage reaches a favorable Vdd condition, such as when the Vdd voltage is at or more than a predetermined threshold value.

With the deassertion of the POR_raw signal, DC biasing start-up circuit 108 is caused to deassert the CLR signal. As mentioned above, the deassertion of the CLR signal is also subject to pulse stretching so that the deassertion of the CLR signal is delayed from the deassertion of the POR_raw signal. The delay is denoted as ST2 in FIG. 3. By introducing the ST2 delay, the POR circuit ensures that the CLR signal has sufficient pulse width and amplitude to reliably clear the counter circuit 112 which will assert RUN, allowing the gated ring oscillator 106 to start.

Finally, when the CLR signal is deasserted, counter circuit 112 is allowed to run its preprogrammed number of clock cycles. When the maximum number of count is reached, counter circuit 112 deasserts the RUN signal. The delay time between the deassertion of the CLR signal and the deassertion of the RUN signal is the time Td which is the time required for counter circuit 112 to run though its count. As the clock pulse width of counter circuit 112 can be self adjusted to compensate for the supply voltage, temperature, process variance, delay time Td represents a self-adaptive pulse stretching technique implemented to increase the persistence of the reset signal.

When the RUN signal is deasserted, both input signals to OR gate 114 of FIG. 2 are at a logical low value and the reset signal is thus deasserted (logical low). The integrated circuit is then put into normal operation.

As can be seen from FIG. 3, after vdd recovers from an Vdd event, the power-on reset (reset) signal is asserted for a time long past the point where the Vdd voltage have reached a satisfactory level, such as the logic threshold level. The extended reset signal persistence includes three pulse stretching techniques operative to prolong the duration of the POR pulse to ensure that all digital and logic circuitry on the integrated circuit has sufficient time to reset before being put back into normal circuit operation. The operation of the pulse stretching techniques will be described in brief below.

Reset Pulse Stretching Techniques

As described above, the POR circuit of the present invention employs several "pulse-stretching" techniques to enhance the power-on reset signal assertion persistency. Specifically, an analog pulse stretching technique is used to stretch the duration of the POR_raw signal, an analog pulse stretching technique is used to stretch the duration of the CLR signal and a self-adaptive digital pulse stretching technique using the RUN signal is used to further delay the deassertion of the reset signal. The analog and digital pulse stretching techniques are used in combination to produce a reset signal so that the final reset signal has been stretched by both analog and digital delays to always guarantee a sufficiently long enough POR pulse to ensure that every circuit on the integrated circuit has been successfully reset or initialized. The interlocking nature of the POR circuit absorbs any amount of variable delay for each circuit block in the POR circuit to work. The only result of the multiple pulse stretching techniques is that the chip wide POR signal is further stretched.

The operation of the pulse stretching techniques will be described in brief here. The detail construction of the circuit blocks to realize the analog and digital pulse stretching will be described in more detail below.

Figure 15:
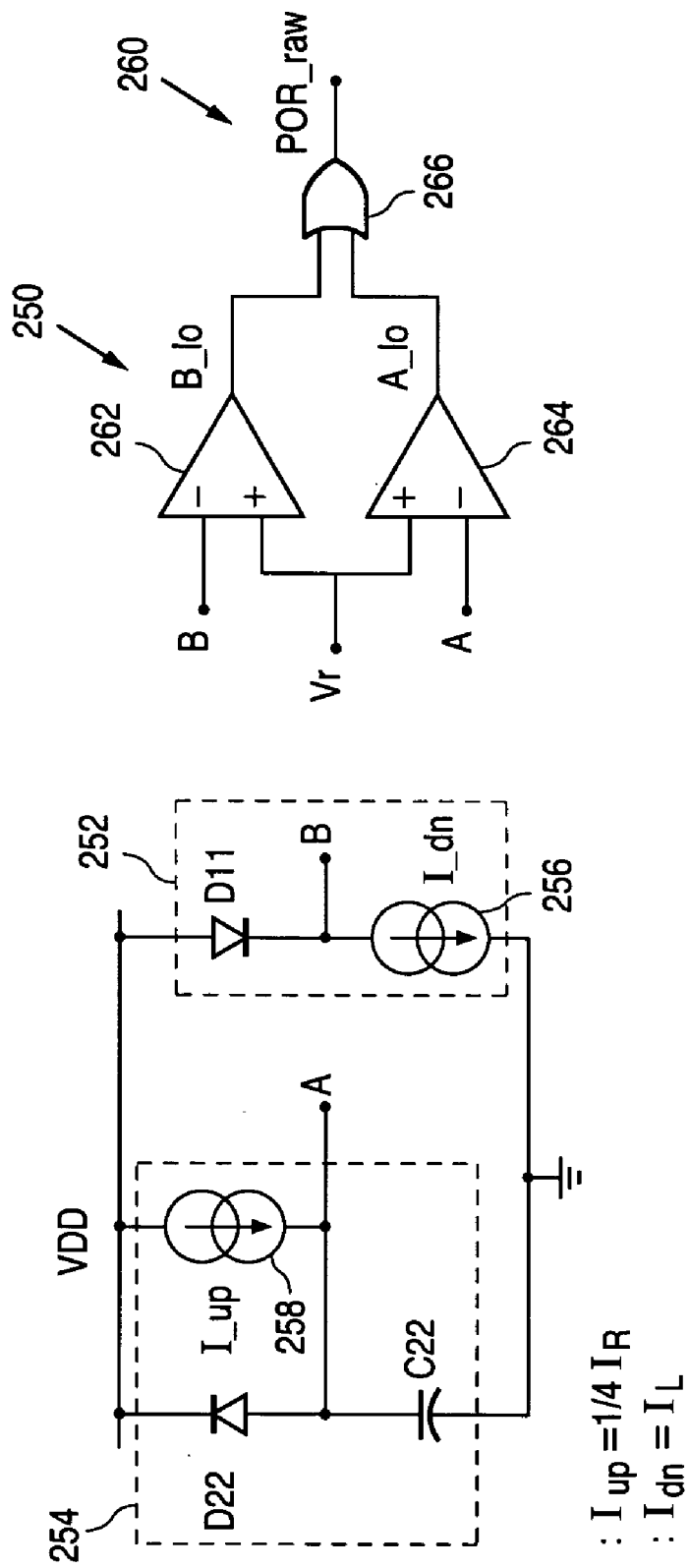
FIG. 15 is a circuit diagram illustrating the implementation of the Vdd threshold detector according to one embodiment of the present invention.

First, in the Vdd threshold detector circuit of FIG. 15, a first voltage (denoted "voltage A") is used to indicate AC Vdd events such as a Vdd glitch. In operation, voltage A follows the Vdd voltage down at a very high slew rate when the Vdd voltage dips. However, analog pulse stretching is implemented by using a controlled slew rate to charge up voltage A when the Vdd voltage returns to nominal values. Thus, when the Vdd voltage goes positive at a high slew rate, such as during a Vdd glitch, the controlled slew rate of voltage A, provided by the charging of a capacitor (capacitor C22) in the Vdd threshold detector circuit, stretches the time required for voltage A to reach its POR_raw off state. In this manner, even during a narrow Vdd event, the POR_raw signal is widened to extend the persistence of the final reset signal. The analog pulse stretching provided by the controlled recharge slew rate of voltage A is denoted as ST1 in FIG. 3.

Second, the DC biasing start-up circuit asserts the CLR signal when a Vdd event is detected and the POR_raw signal is asserted. When the Vdd voltage recovers, the CLR signal is to be deasserted. In accordance with the present invention, the deassertion of the CLR signal is a function of the discharge slew rate of a capacitor (capacitor C2) in the DC biasing start-up circuit of FIG. 21. By using a capacitor of the appropriate capacitance value, the discharge slew rate can be slowed down to increase the discharge time and thereby slow down the deassertion of the CLR signal. In this manner, analog pulse stretching is implemented in the DC biasing start-up circuit to stretch the CLR deassertion which eventually leads to stretching of the reset signal. The analog pulse stretching provided by the controlled discharge slew rate of the CLR signal is denoted as ST2 in FIG. 3.

Lastly, self-adaptive digital pulse stretching is provided by the delayed deassertion of the RUN signal which forces the reset signal to be asserted for at least a predetermined number of clock cycles ($T_d$) after the deassertion of the CLR signal indicating that the Vdd voltage has returned to normal. As the clock pulse width of counter circuit 112 is a direct function of the supply voltage, temperature, process variance, the delay time Td is self-adaptive to the timing and voltage needs of all digital circuits at every specific condition influenced by the above mentioned variables. Thus, the reset signal is deasserted at least Td cycles after the CLR signal is deasserted. In operation, the delay time Td is added on top of the delay time introduced by pulse stretching durations ST1 and ST2 to prolong the final reset signal persistence.

The digital pulse stretching is realized by the counter circuit receiving the CtR signal from the DC biasing start-up circuit. During a Vdd event, the CLR signal is asserted. When the CLR signal is asserted, the counter circuit, e.g. a 4-bit counter, is reset to a count of "0000" and the RUN signal, generated by the counter circuit is asserted (logical high). When the Vdd voltage recovers sufficiently and the DC biasing start-up circuit has started up, the CLR signal is deasserted (logical low). The deassertion of the CLR signal releases the 4-bit counter and the counter is thus allowed to run through its predetermined number of cycles (Td). When the counter reaches its maximum count, such as when the "1111" code is detected, the RUN signal is deasserted (logical low). The deassertion of the RUN signal has two effects. First, the ring oscillator is stopped. Second, the POR_raw signal is logically OR'ed with the RUN signal to generate the reset signal. The POR_raw signal has already gone low when the Vdd voltage recovers. When the RUN signal goes low, the reset signal will finally be deasserted to indicate the termination of the reset condition. Since the RUN signal is gated with the POR_raw signal to generate the reset signal, the reset signal used to re-initialize the entire integrated circuit is digitally stretched to be much wider than the POR_raw signal.

For slow changing (slow rising) Vdd voltages, Vdd has to go above 1.0 volts before POR_raw, CLR and RUN are asserted, allowing the gated ring oscillator to begin oscillating even if it operates very weakly at a very low frequency. The counter can begin to slowly count the $T_d$ clock cycles only after CLR is deasserted. The POR_raw, CLR and RUN signals are deasserted after Vdd returns above the POR circuit logic threshold, which is about 1.5 volts, where both the digital and analog circuitry can return to functionality. At that time, the counter is free to run its predetermined number of cycles, thus stretching the reset pulse. Of course, if Vdd remains below the 1.5 volts logic threshold, the counter will not count at all, but the oscillator will oscillate providing current Iboost and the POR_raw signal will continue to be asserted until Vdd rises above the logic threshold voltage limit.

By delaying the deassertion of the POR_raw signal, the deassertion of the CLR signal thereby delaying the start of the Td count down, and by using the RUN signal, the reset pulse generated by the POR circuit of the present invention is stretched in the digital and analog domains beyond when the POR_raw signal is deasserted. The combination of the digital pulse stretching and the analog pulse stretching ensures that the digital and/or analog circuitry on the integrated circuit is properly reset before the reset signal is released. Typically, analog circuitry requires longer time to reset than digital circuitry. While the POR_raw signal alone may be sufficient to reset the digital logic circuitry, the POR_raw signal alone may not provide sufficient time to reset analog circuitry. By delaying the assertion of the CLR signal and by using the RUN signal, the reset pulse is stretched long enough to guarantee reset of any digital or analog circuitry on the integrated circuit.

Power-On Reset Circuit Block Details

The detail implementation of the functional blocks of POR circuit 100 of FIG. 2 will now be described in detail.

Self-Regulating Watchdog Current Source

A traditional way of making a self-regulating current source is to use a current mirror with non-equal areas and insert a degeneration resistor in the source of the larger device. FIG. 4 is a circuit diagram of a conventional self-regulating current source with its negative feedback loop disabled for the purpose of measuring load line current. FIG. 5, including FIGS. 5A and 5B, contains waveforms illustrating the operation of the current source of FIG. 4. As shown in FIG. 5, the operating point of the current source is at the intersection of the input line Iin and the load line Iout, but the precision of the resulting current depends greatly on the slope of the non-linear load line at the intersection point in the presences of non-linear perturbation.

Figure 9A:
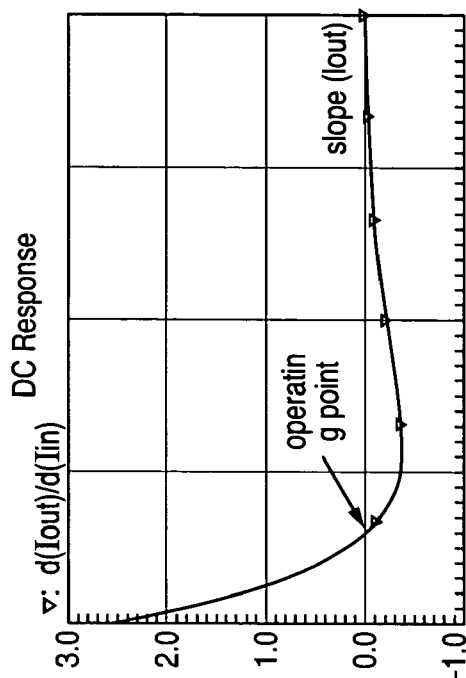
FIG. 9, including FIGS. 9A and 9B, contains waveforms illustrating the operation of the current source of FIG. 8.
Figure 9B:
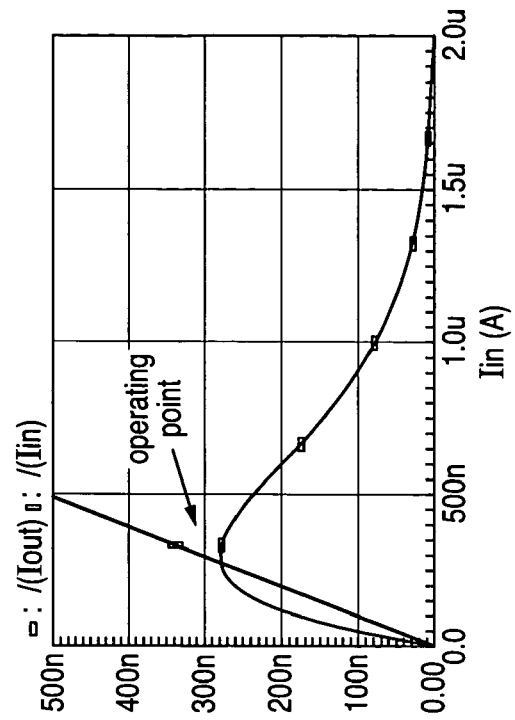
Figure 8:
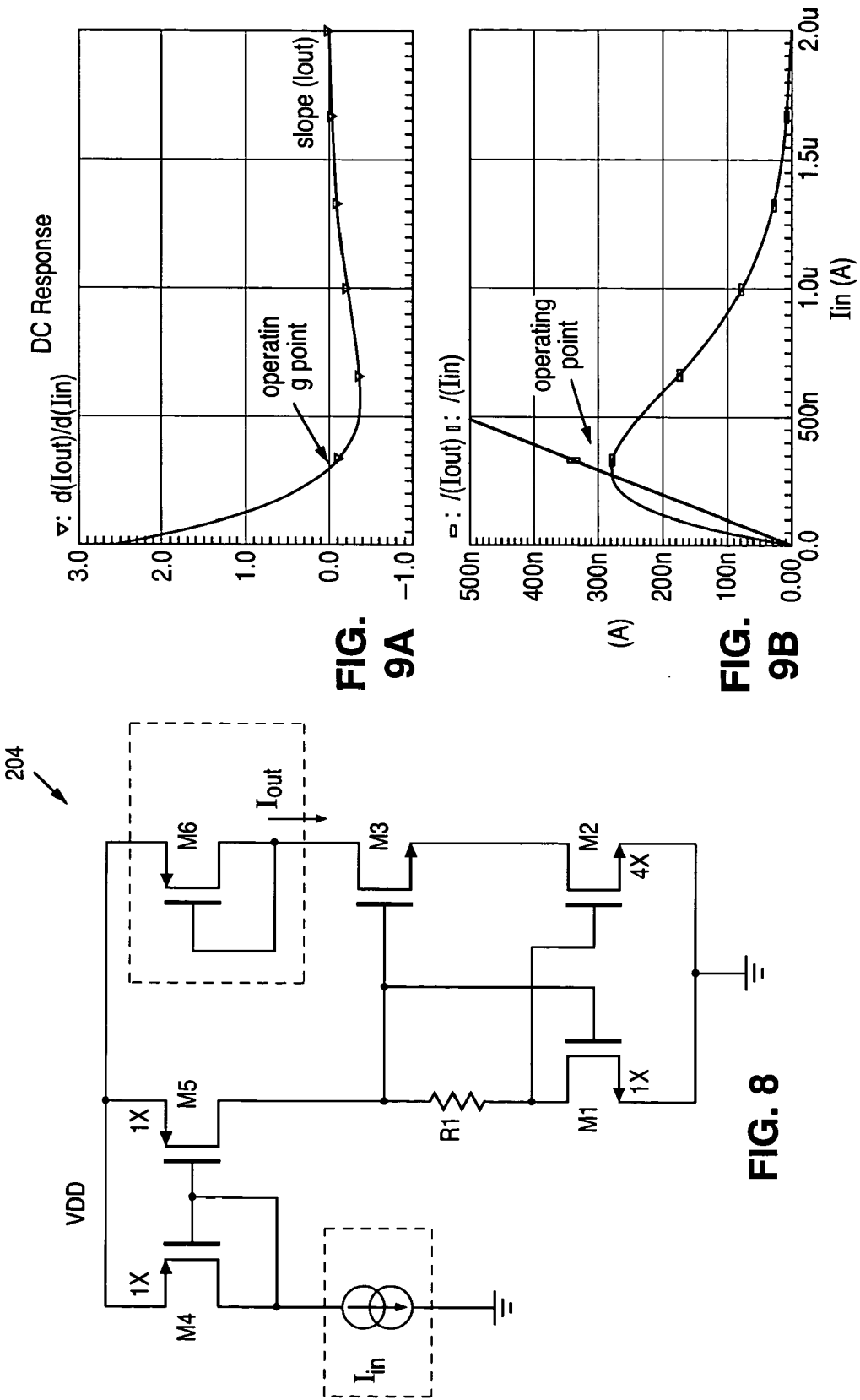
FIG. 8 is a circuit diagram of the self-regulating current source of FIG. 6 with its feedback loop disabled for the purpose of measuring load line current.

According to one aspect of the present invention, a self-regulating current source capable of generating a stable output current over variations in process and operating conditions is disclosed. FIG. 6 is a circuit diagram of a self-regulating current source with its feedback enabled according to one embodiment of the present invention. FIG. 7, including FIGS. 7A and 7B, contains waveforms illustrating the operation of the current source of FIG. 6. FIG. 8 is a circuit diagram of the self-regulating current source of FIG. 6 with its feedback loop disabled for the purpose of measuring load line current. FIG. 9, including FIGS. 9A and 9B, contains waveforms illustrating the operation of the current source of FIG. 8.

The construction of the self-regulating current source will be first described with reference to FIG. 6. Referring to FIG. 6, self-regulating current source 204 includes a first current mirror formed by equally sized PMOS transistors M4 and M5. The drain terminal (node N14) of transistor M4 provides a current $I_R$ and the drain terminal (node N12) of transistor M5 provides a current $I_L$. Current source 204 also includes a second current mirror formed by differently sized NMOS transistors M1 and M2. In the present embodiment, transistor M2 has an area four times larger than transistor M1. A degeneration resistor R1 is coupled between the drain terminal (node N10) of transistor M1 and the drain terminal (node N12) of transistor M5. The degeneration resistor R1 is thus positioned in series with the drain terminal of the smaller transistor in the NMOS current mirror. An NMOS transistor M3 is coupled between the drain terminal (node N16) of transistor M2 and the drain terminal (node N14) of transistor M4 to act as a cascode transistor for transistor M2, providing the drain terminal of transistor M2 with a Vdd independent voltage, Vds2.

Transistors M1 and M2 are cross-connected so that the gate-to-source voltage (Vgs) of the two transistors are coupled to the two terminals of resistor R1. In effect, the difference between the Vgs voltages (delta_Vgs) of transistors M1 and M2 is impressed across resistor R1. Specifically, the gate terminal of transistor M1 is coupled to a first terminal (node N12) of resistor R1 which is also coupled to the gate terminal of transistor M3. The gate terminal of transistor M2 is coupled to a second terminal (node N10) of resistor R1, which is also the drain terminal of transistor M1.

As thus configured, the PMOS current mirror of self-regulating current source 204 reflects the current which flows through resistor R1 and the NMOS current mirror. By choosing different sizes for the NMOS transistors M1 and M2 and forcing the NMOS devices to operate at similar currents, a difference in their gate-to-source Vgs voltages is created and that difference in Vgs voltages (delta_vgs) is imposed across resistor R1. At currents well below the intended operating point, there is a net positive gain around the feedback loop existing inherent in the interconnection of the symmetrical PMOS and asymmetrical NMOS current mirrors. At currents higher than the intended operating point, the voltage at the bottom terminal (node N10) of resistor R1 can approach nearly 0 volts, thus turning the NMOS transistor M2 off. At some intermediate value of current, the voltage drop across resistor R1 perfectly matches the delta_Vgs voltage and the circuit reaches equilibrium.

In self-regulating current source 204 of FIG. 6, the regulated current $I_R$ displays extremely good power supply rejection. Referring to FIG. 7 which illustrates the current magnitude versus Vdd voltage for the DC response of the current source, the slope of regulated current $I_R$ is essentially zero for Vdd voltage values ranging from 1 volt to 5 volts. Thus, a high PSRR (power supply rejection ratio) is achieved in current source 204. The lower graph in FIG. 7 is an expanded view of regulated current $I_R$ and regulated current $I_L$ showing the near zero slope nature of the regulated current $I_R$. In the present embodiment, currents $I_L$ and $I_R$ are of substantially equal magnitude. However, one of ordinary skill in the art would appreciate that self-regulating current source 204 can be reconfigured to adjust the current magnitude of current $I_R$ by adjusting the sizes of transistors M1, M2, M4 and M5. For example, transistor M4 can be made 4 times larger than transistor M5 in the PMOS current mirror to increase the current magnitude of current $I_R$. Transistors M1 and M2 need to be readjusted to provide the right delta-Vgs voltage to resistor R1 to produce current $I_L$.

By positioning the degeneration resistor R1 in series with the drain terminal of transistor M1 and by connecting the gate terminal of transistor M2 to the drain terminal of transistor M1, a highly non-linear transfer function is created where the transfer function actually has a point of zero slope. Referring to FIG. 8, the negative feedback loop of current source 204 is disabled for the purpose of measuring load line current. A diode-connected transistor M6 is coupled to transistor M3 to act as the load for transistors M2 and M3. Referring to the waveforms of FIG. 9, the load line Iout actually has a zero slope at a certain operating point. By arranging for the linear input line (Iin) to intersect the non-linear load line (Iout) at the zero slope point, the sensitivity of the output current Iout to the input current Iin becomes incrementally or asymptotically zero. In FIG. 9, it can be seen that the slope of current Iout at the operating point is essentially zero, making the poor regulation in the current of transistor M5 as the Vdd voltage changes to have essentially no effect on the current of transistor M2.

An advantage of the self-regulating current source of the present invention over the conventional circuits is the ability of resistor R1 to act as a load resistor, resulting in the regulated output current becoming desensitized to small perturbations in the power supply voltages. Due to opposing and exactly opposite changes in transistor M1's Vgs voltage and resistor R1's voltage drop, producing a net zero change at the gate terminal of transistor M1, the loop gain of the current source is decreased to zero at the intended operating currents. Additionally, on either side of this zero-slope point, there exists a restorative negative feedback action. Another benefit of the self-adjusting feedback of the current source of the present invention is increased immunity to many processing variables, which results in well behaved and predictable minimal changes in operating current over manufacturing process variations and temperature variations.

Figure 10:
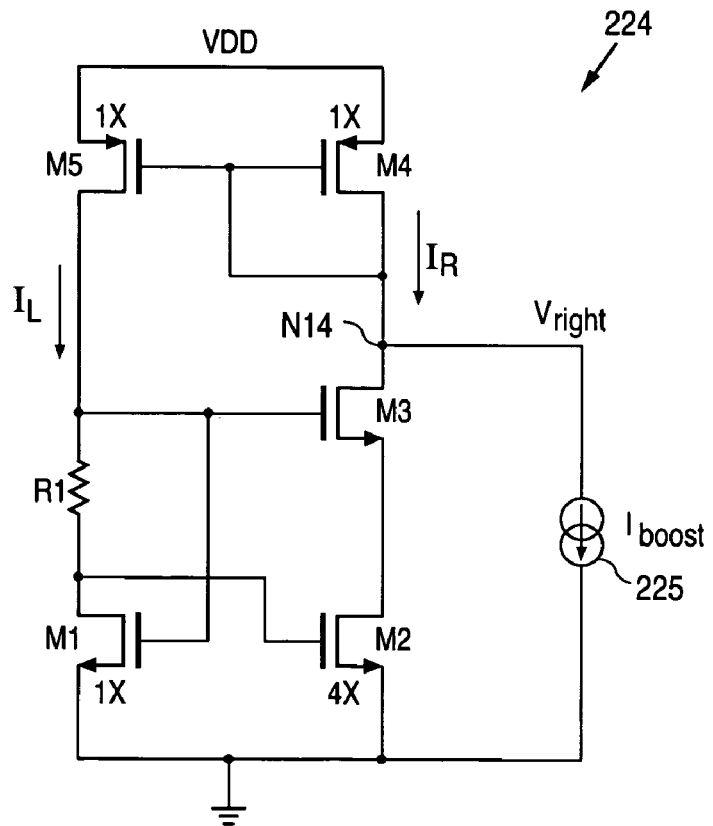
FIG. 10 is a circuit diagram of a self-regulating current source according to an alternate embodiment of the present invention.

According to another embodiment of the present invention, the self-regulating current source further receives a boost current $I_{boost}$ for providing start-up assistance. FIG. 10 is a circuit diagram of a self-regulating current source according to an alternate embodiment of the present invention. Referring to FIG. 10, self-regulating current source 224 is constructed in the same manner as current source 204 of FIG. 6. Like elements in FIG. 6 and FIG. 10 are given like reference numerals to simplify the discussion. In current source 224, a current $I_{boost}$, denoted by a representative current source 225, is coupled to the drain terminal (node N14) of diode-connected transistor M4. Node N14 will be referred to as the "regulated current node" in the present description. Current $I_{boost}$ is actually a current that is drawn out of node N14. Transistors M5 and M4 form a unity gain current mirror and complete the feedback path for the boost current $I_{boost}$. The circuit becomes self-regulating once current $I_{boost}$ is turned off.

When the boost current $I_{boost}$ is added to current source 224, the currents around the feedback loop of the current source are guaranteed to be always much greater than any possible leakage currents in the circuit. The addition of current $I_{boost}$ thus precludes the possibilities of a second stable operating point with uselessly low currents from ever being possible.

Normally, leakage currents in all the MOS devices will start the self-regulating current source circuit of the present invention even without any external aid. However, it is possible that at very low temperatures, certain process conditions may make start-up too slow or even unreliable. To make start-up on this key block of the POR circuit extremely reliable, boost current $I_{boost}$ is added to the drain terminal of diode-connected transistor M4 of the PMOS current mirror. The boost current $I_{boost}$ ensures that self-regulating current source 224 will start up at almost all operating conditions and will settle into the desired operating point. In the present embodiment, the boost current $I_{boost}$ is generated by the gated ring oscillator of the POR circuit. Specifically, the power supply voltage Vright of the gated ring oscillator is coupled to the drain terminal of diode-connected transistor M4 of the PMOS current mirror, that is, the regulated current node. The operation of the gated ring oscillator draws current from the supply voltage node (Vright), thereby creating the boost current $I_{boost}$. At very low Vdd voltages, the gated ring oscillator only needs to provide a very low level of current, such as nanoamperes of current, to regenerate the current source.

In practice, the boost current from the gated ring oscillator is guaranteed to exceed the start-up current threshold of the self-regulating current source at Vdd levels below which logic circuitry first start to work. The start-up current threshold of the current source is typically very low. In this manner, the application of the boost current ensures that the self-regulating current source is operational before the logic circuitry is operational. In this manner, the Vdd threshold detector, biased by the self-regulating current source, is properly biased before Vdd thresholds that may trigger a POR transition are reached.

When self-regulating current source 224 is incorporated in POR circuit 100 and boost current $I_{boost}$ is provided by the gated ring oscillator, the boost current is only present during power-up of the Vdd voltage and up to the predetermined number of clock cycles as determined by the counting of the counter circuit. Once the count has run up and the RUN signal is deasserted, the self-regulating current source quickly reaches a precise equilibrium state, setting the entire POR circuit at normal quiescent conditions.

In accordance with the present invention, the self-regulating current source functions as a watchdog current source. Basically, once the self-regulating current source is turned on, it will remain on all the time and the current source will only fail when the Vdd voltage falls below the minimum operative voltage which is about 0.8 volts. The self-regulating current source will supply current to the Vdd threshold detector at Vdd voltages well below the Vdd threshold detector trigger point.

Figure 11:
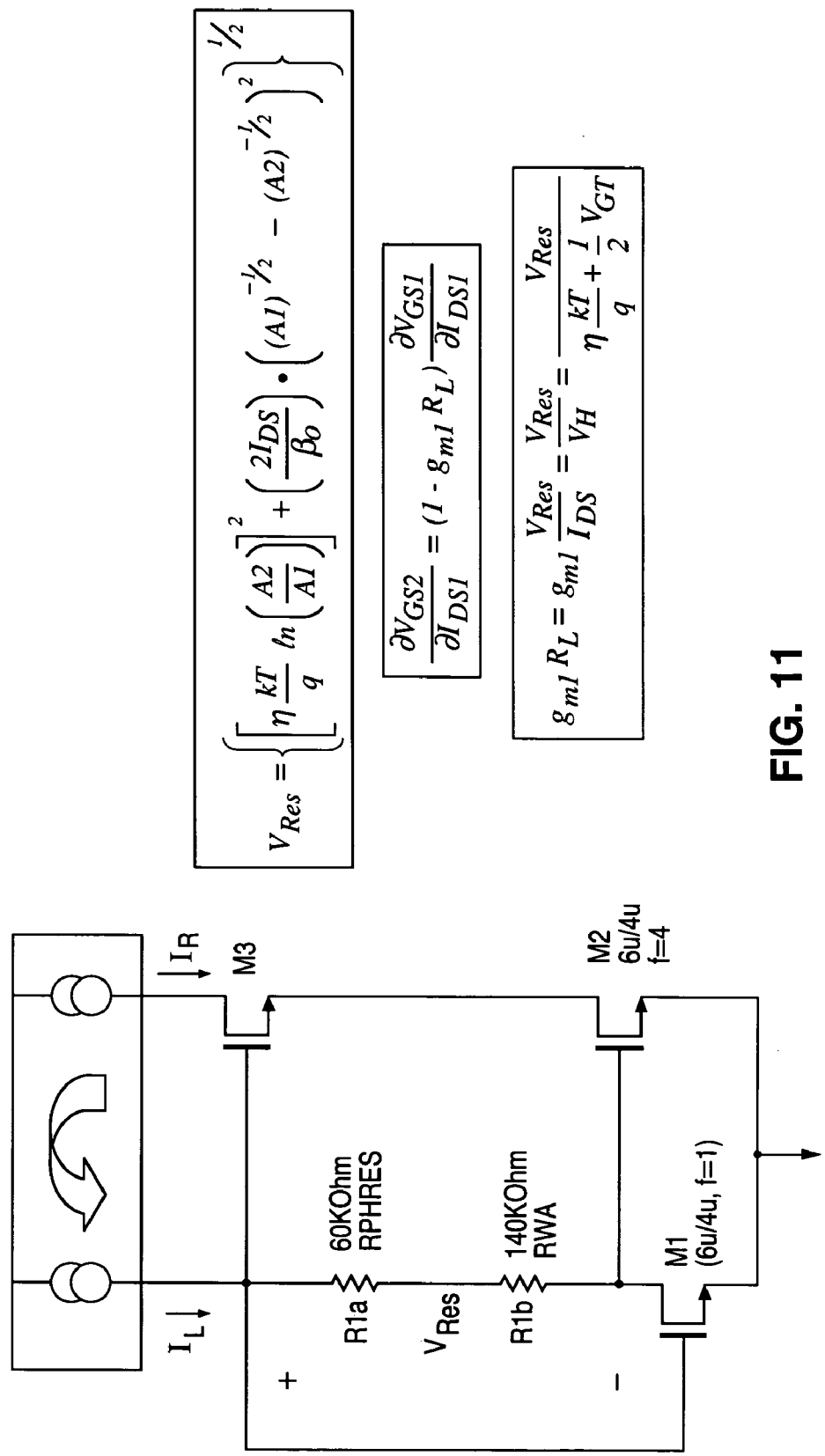
FIG. 11 is a circuit diagram and equations illustrating the operational principles of the self-regulating current source according to one embodiment of the present invention.

FIG. 11 is a circuit diagram and equations illustrating the operational principles of the self-regulating current source according to one embodiment of the present invention. The voltage $V_{Res}$ across the resistors is basically the difference between the gate-to-source voltages of transistors M1 and M2. The PMOS constructed current mirror shown connecting to transistor M3's drain terminal and the top terminal of resistor R1a forces currents $I_R$ and $I_L$ to be equal. Because transistor M1 has an effective W/L (width/length), herein denoted as $A_1$, which is 1/4 that of transistor M2's W/L or $A_2$, the gate-to-source voltages of these two NMOS devices cannot be the same, but differ by a delta_Vgs ($\Delta$Vgs). This is expressed as delta_Vgs=Vgs1−Vgs2=$V_{Res}$. Thus, the current $I_L$, and therefore the current $I_R$, is forced to be equal to [$V_{Res}$/(R1a+R1b)].

The equation for voltage $V_{Res}$ can be derived from evaluation of both minority carrier and majority carrier currents as a function of $I_L=I_{DS1}$. This equation is stated in FIG. 11 as the topmost equation with some approximation. Any variation in current $I_L$ that occurs from changes in Vdd due to finite PSRR (power supply rejection ratio) ideally should not be passed on to current $I_R$ so that the regulation of current $I_R$ is as independent of Vdd as possible. The novel arrangement included within the self-regulating current source of the present invention adds a load resistor $R_L$=R1a+R1b in series between the gate terminal and the drain terminal of transistor M1. As current $I_L$ increases with Vdd, for example, voltage Vgs1 will increase more slowly. Concurrently, increases in current $I_L$ cause a bigger voltage drop across $R_L$ that works in opposition to the increase in voltage Vgs1. By proper choice of transistor M1's operating point, it is possible to have the transconductance of transistor M1 approximately equal to the reciprocal of load resistor $R_L$. As shown in the second equation in FIG. 11, when gm1×$R_L$=1, changes in Vgs1 do not cause changes in Vgs2 because the first of two terms on the right side of the equation goes to zero. In this preferred embodiment, this operating condition is chosen, although those skilled in the art of analog circuit design will recognize that the self-regulating current source of the present invention will function even when this condition is not met. In fact, the operation of the current source will converge and operate at a stable bias point for a wide range of gm1×$R_L$ products; however, the PSRR of the circuit reaches an optimum when gm1×$R_L$ is chosen to be unity. The last equation shown in FIG. 11 gives a means to calculate and evaluate how close to unity the gm1×$R_L$ product is based on first principles analysis.

Figure 13:
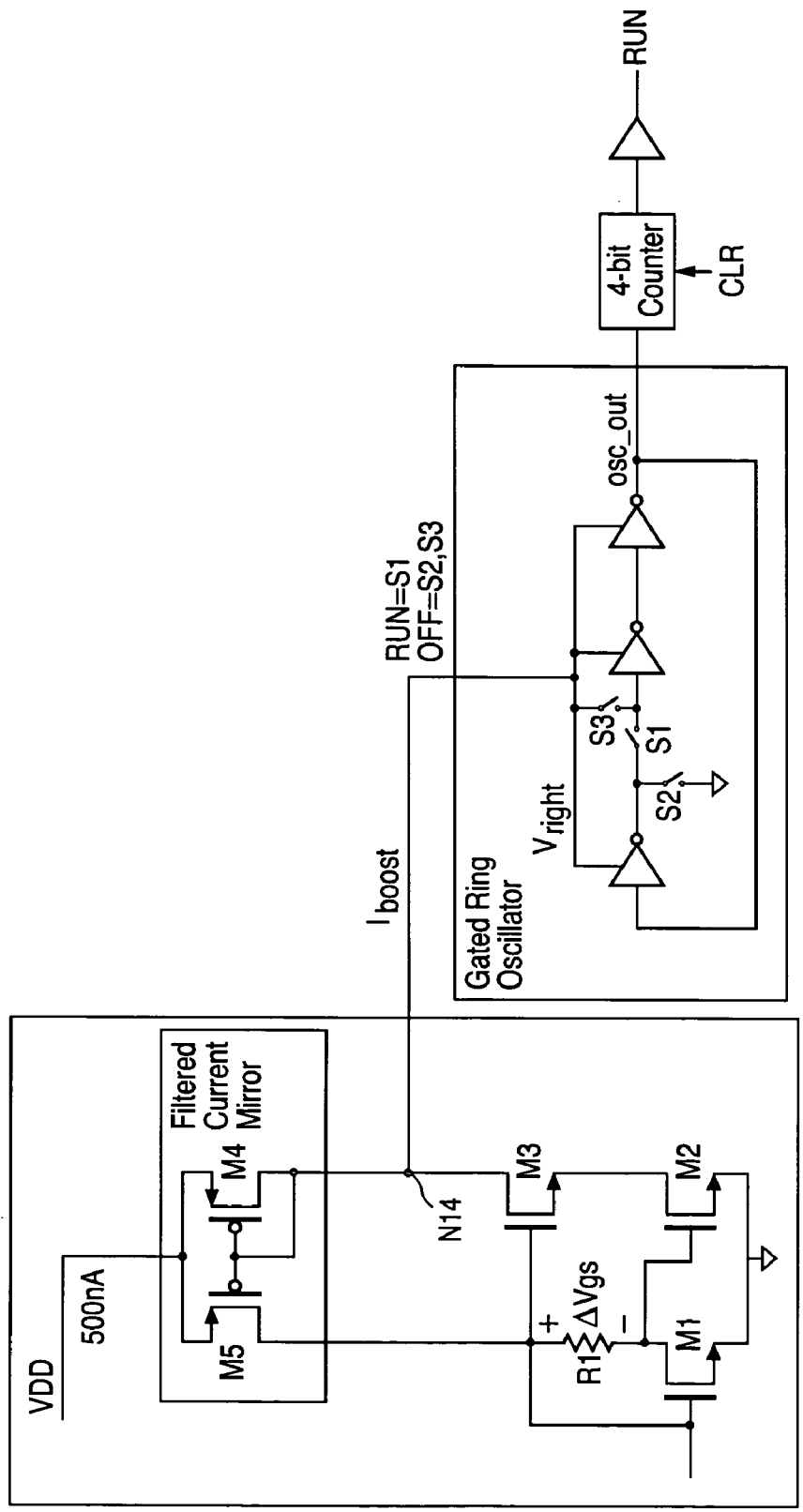
FIG. 13 is a circuit diagram illustrating the coupling of the gated ring oscillator to the self-regulating current source for providing the current $I_{boost}$ according to one embodiment of the present invention.
Figure 19:
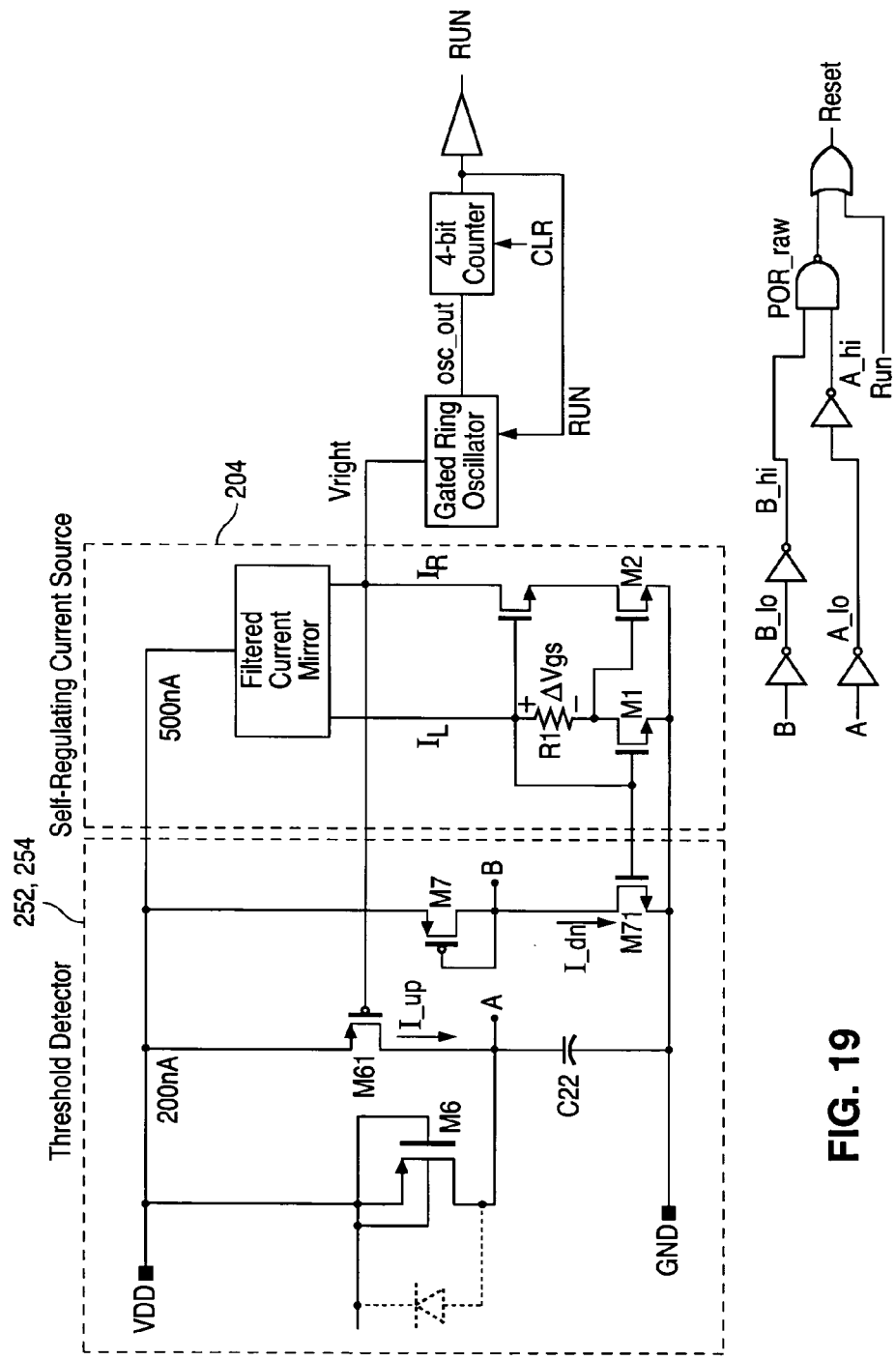
FIG. 19 is a circuit diagram illustrating the coupling of the Vdd threshold detector to the self-regulating current source in the POR circuit according to one embodiment of the present invention.

FIG. 13 illustrates the inter-connection of the self-regulating current source with the gated ring oscillator. When the oscillator is running, the three inverters draw a current. This current is called Iboost and it terminates in diode connected PMOS transistor M4. The boost current is temporarily supplied during a normal VDD driven POR sequence to ensure that the self-regulating current source has sufficient starting current to regenerate and fully start up, especially when leakage currents alone fall below the several nano-Amperes required for complete regeneration and startup. The boost current consists of sharp spikes of current of short time duration. The presence of additional PMOS devices whose gate terminals are connected to the gate terminal of transistor M4 increases the capacitance at this node (N14) and provides a low pass filter smoothing function so that the I_up and I_dn currents take on more of a DC quality when the ring oscillator is operating. As shown in FIG. 19 and to be discussed in more detail below, a PMOS device M61 and the source and N-well connections of the PMOS transistors of the three inverters within the ring oscillator further contribute to this filtering action.

Returning to FIG. 6, the self-regulating current source of the present invention generates a regulated current $I_R$ at the drain terminal of PMOS transistor M4 and a regulated current $I_L$ at the drain terminal of PMOS transistor M5. Additional PMOS or NMOS transistors can be coupled to the self-regulating current source of the present invention for forming current mirrors to generate additional output currents that are derived from and proportional to the regulated current $I_R$ or $I_L$. FIG. 19 illustrates the use of a PMOS transistor and an NMOS transistor for forming the current mirror for mirroring the regulated current $I_R$ or $I_L$.

Referring to FIG. 19, a PMOS transistor M61 is used to mirror current $I_R$ to generate current I_up. To form a current mirror, the gate terminal of transistor M61 is to be connected to the gate terminals of the transistors in the filtered current mirror. When the filtered current mirror is implemented as a PMOS current mirror as shown in FIG. 6, the gate terminals of transistors M4 and M5 are connected to the drain terminal of transistor M4 (node N14) providing the regulated current $I_R$. Thus, the gate terminal of PMOS transistor M61 can be connected to node N14 to form a current mirror with transistor M4 of the filtered current mirror so that current I_up is mirrored from current $I_R$ and is proportional to the regulated current $I_R$. The size of transistor M61 is selected to obtain the desired value for current I_up. For example, transistor M61 can be one-fourth the size of transistor M4 to provide a current I_up that is one-fourth the current $I_R$.

In FIG. 19, an NMOS transistor M71 is used to mirror regulated current $I_L$ to generate current I_dn. To form a current mirror, the gate terminal of transistor M71 is to be connected to the gate terminal of NMOS transistor M1 or M2 in the self-regulating current source. In the present illustration, the gate terminal of transistor M71 is coupled to the gate terminal of transistor M1 to mirror current $I_L$. In other embodiments, the gate terminal of transistor M71 can be coupled to the gate terminal of transistor M2 to mirror current $I_R$. The size of NMOS transistor M71 is selected to obtain the desired value for current I_dn. Because transistors M1 and M2 have dissimilar sizes, the size of transistor M71 should be selected to match the NMOS transistor (M1 or M2) to which transistor M71 is coupled. For example, if current I_dn is mirrored from current $I_L$ and is to be equal to the regulated current $I_L$, the size of transistor M71 should be the same as transistor M1. If current I_dn is mirrored from current $I_R$ and is to be equal to the regulated current $I_R$, the size of transistor M71 should be the same as transistor M2.

Gated Ring Oscillator

As described above, in the present embodiment, the boost current $I_{boost}$ is provided to the self-regulating current source by connecting the power supply voltage Vright of the gated ring oscillator to the regulated current node (diode-connected PMOS transistor M4) of the current source. Coupling the current Iboost from the gated ring oscillator serves two important functions. First, the gated ring oscillator draws current from the power supply voltage Vright to create current Iboost. In this manner, the boost current forces the self-regulating current source to start up and the self-regulating current source is assured to start up regardless of the process conditions or operating temperature conditions.

Second, by placing an extra PMOS diode (transistor M4) in series with the internal power supply rail (voltage Vright) of the gated ring oscillator's inverter devices, an extra diode voltage drop is added to the Vdd voltage to ensure that all other digital circuitry will be functional when the POR pulse is deasserted. Specifically, as Vdd is increasing, by the time that the ring oscillator is disabled by the RUN signal, the rest of the digital circuitry on the integrated circuit will have a full PMOS diode voltage drop higher than the ring oscillator internal supply voltage (Vright). This configuration guarantees that none of the Vdd connected digital circuitry could possibly be operating at too low a voltage to reliably work. Thus, a reset signal generated from the POR circuit of the present invention will always effectively reset all digital circuitry.

Figure 12:
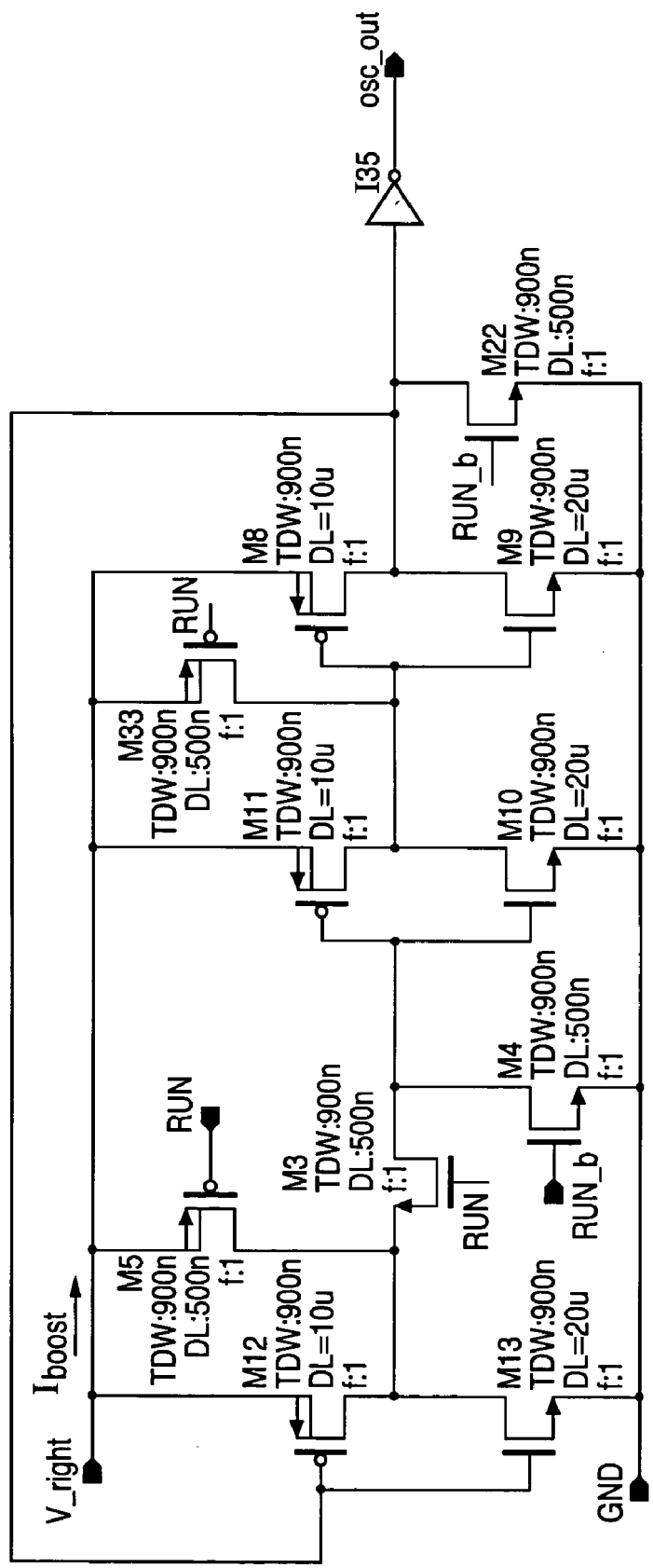
FIG. 12 is a circuit diagram of a gated ring oscillator which can be incorporated in the POR circuit according to one embodiment of the present invention.

FIG. 12 is a circuit diagram of a gated ring oscillator which can be incorporated in the POR circuit according to one embodiment of the present invention. In the embodiment shown in FIG. 12, the gated ring oscillator is implemented as three serially connected inverters. By-pass transistors controlled by the RUN or the inverse RUN_b signal are included to disable the oscillator when the RUN signal is deasserted. An output signal osc_out is provided at the third inverter output. The osc_out signal is buffered by an inverting buffer.

FIG. 13 is a circuit diagram illustrating the coupling of the gated ring oscillator to the self-regulating current source for providing the current $I_{boost}$ according to one embodiment of the present invention. As shown in FIG. 13, the voltage Vright is the power supply voltage of the three serially connected inverters. The power supply node vright is connected to the regulated current node (node N14) of the self-regulating current source to draw a current $I_{boost}$ from the regulated current node (N14) when the oscillator is oscillating. An alternative by-pass setup is used to disable the oscillator when the RUN signal is deasserted. In FIG. 13, the osc_out signal is coupled to the counter circuit which is illustrated as a 4-bit counter. The counter circuit generates the RUN signal which is in turn coupled to the gated ring oscillator to enable or disable the oscillation.

Counter Circuit

As described above, counter circuit 112 of POR circuit 100 is used to implement digital pulse stretching of the reset signal. Specifically, when the CLR signal to the counter circuit is deasserted, indicating that the Vdd voltage has recovered sufficiently, the counter circuit is then enabled to count out its predetermined number of counts. However, it is important to note that the gated ring oscillator is running and providing a boost current to the self regulating current source even if the counter is held in its CLR state. The counting of the counter circuit provides the digital pulse stretching of the reset pulse. The size of the counter circuit can be selected to provide the desired amount of delay Td. In the present embodiment, counter circuit 112 is a 4-bit counter and 16 count-up cycles are possible. In other embodiments, a counter circuit providing any desirable number of count-up or count-down cycles can be used.

Figure 14:
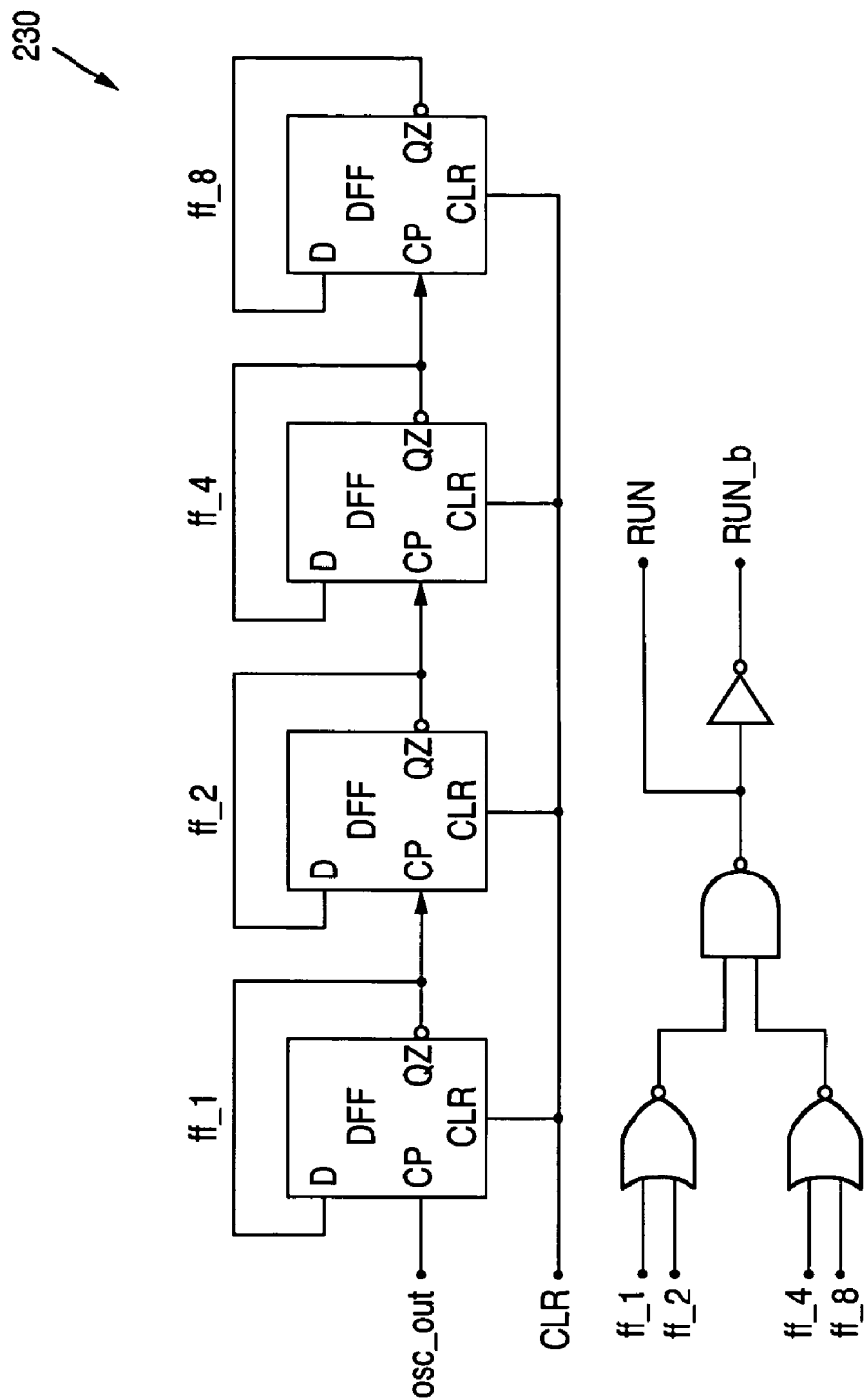
FIG. 14 is a circuit diagram of a 4-bit counter which can be incorporated in the POR circuit according to one embodiment of the present invention.

FIG. 14 is a circuit diagram of a 4-bit counter which can be incorporated in the POR circuit according to one embodiment of the present invention. Counter circuit 230 is implemented using four serially connected D-flip flops. The "QZ" output of each D-flip flop is coupled to the D input terminal of the respective D-flip flop. The oscillator output signal osc_out is the clock signal for the first D-flip flop. The logic gates in bottom portion of FIG. 14 illustrate the logic circuitry used to generate the RUN and RUN_b signal. When the counter is cleared, the QZ outputs of the D-flip flops are at logical high states causing the RUN signal to be at a logical high state as well. When the counter completes its count, the QZ outputs of the D-flip flops are at logical low states causing the RUN signal to be at a logical low state.

Vdd Threshold Detector

As described above, POR circuit 100 includes a Vdd threshold detector capable of detecting an entire range of AC and DC Vdd events. FIG. 15 is a circuit diagram illustrating the implementation of the Vdd threshold detector according to one embodiment of the present invention. Referring to FIG. 15, Vdd threshold detector 250 includes a DC level detect circuit 252 and an AC level detect circuit 254. The DC level detect circuit and the AC level detect circuit operates in conjunction to generate the POR_raw signal to indicate the detection of an Vdd event.

DC level detect circuit 252 includes a diode D11 coupled between the Vdd supply voltage and a node B. The anode of diode D11 is coupled to Vdd while the cathode is coupled to node B. A bias current I_dn, provided by the self-regulating current source, is coupled to node B. The bias current I_dn is denoted by a current source 256 connected between node B and the ground potential. In the present embodiment, bias current I_dn is derived from current $I_L$ of the self-regulating current source and has a 1:1 ratio to current $I_L$. When bias current I_dn is applied, the bias current I_dn operates to pull down the voltage on node B relative to the Vdd voltage and the diode D11 is forward biased. The voltage at node B is thus always a diode voltage drop below the Vdd voltage. The voltage at node B is an indicator voltage for indicating the condition of the Vdd voltage.

AC level detect circuit 254 includes a diode D22 connected in series with a capacitor C22 between the Vdd power rail and the ground potential. The common node between diode D22 and capacitor C22 is a node A. Diode D22 is connected in the reverse manner as diode D11. That is, the cathode of diode D22 is connected to Vdd while the anode is connected to node A. A bias current I_up, provided by the self-regulating current source, is coupled to node A. The bias current is denoted by a current source 258 connected between Vdd and node A. In the present embodiment, bias current I_up is derived from current $I_R$ of the self-regulating current source and is configured to be ¼ times current $I_R$. When current $I_L$ and current $I_R$ have the same magnitude, current I_up is therefore only ¼ times current I_dn. As thus configured, diode D22 is reverse biased and bias current I_up is applied to charge the top plate of capacitor C22. The voltage at node A is an indicator voltage for indicating the condition of the Vdd voltage.

Diodes D11 and D22 can be implemented as p-n junction diodes, bipolar transistors or MOS transistors. In one embodiment, diode D11 is diode connected PMOS transistor and diode D22 is a parasitic junction diode of a PMOS transistor.

In the present embodiment, current I_up is derived from current $I_R$ of the self-regulating current source and current I_dn is derived from current $I_L$ of the self-regulating current source. This configuration is used only because of the different polarities of currents I_up and I_dn and it is more area efficient. In other embodiments, it is possible to use current $I_R$ alone as reference current to provide the currents I_up and I_dn for the Vdd threshold detector. For instance, I_dn can be derived from transistor M2's drain current of FIG. 6.

Additionally, in the present embodiment, current I_up is only one-fourth of current I_dn. Current I_up in AC level detect circuit is purposely made smaller to increase the charging time of capacitor C22. As will be explained in more detail below, when Vdd recovers from an Vdd event, current I_up is used to charge up capacitor C22 until the voltage at node A reaches a predetermined level to indicate that Vdd has recovered sufficiently. A smaller current value of current I_up has the effect of stretching out the time it takes for the voltage at node A to indicate a Vdd recovery, thereby stretching out the POR_raw signal and the final reset pulse. The use of a small charging current and capacitor C22 represents the first analog pulse stretching technique applied in the POR circuit of the present invention to extend the duration of the reset signal.

The operation of DC level detect circuit 252 is as follows. The voltage at node B ("voltage B") will always be a single diode voltage drop below the Vdd voltage. Voltage B can thus sense DC or slow speed Vdd events and most Vdd transient events other than extremely narrow voltage glitches. Voltage B of the DC level detect circuit is compared to a POR threshold to monitor the Vdd voltage condition.

The operation of AC level detect circuit 254 is as follows. The voltage at node A (hereinafter "voltage A") is fully charged to Vdd after any POR event and diode D22 is reverse biased. When the Vdd voltage drops from its nominal value by more than a diode drop, diode D22 becomes forward biased and the voltage at node A is thereafter pulled down in step with the Vdd voltage. In one embodiment, diode D22 is constructed to have a low turn on voltage. Thus, when Vdd goes to 0 volts, node A is pulled down to less than 400 mV at nominal operating conditions. The operation of the AC level detect circuit is very reliable and voltage A follows even the most rapid negative going Vdd pulse faithfully, offset only by a low p-n junction diode voltage drop. During an AC Vdd event, such as a Vdd glitch, voltage A starts at Vdd_nominal and follows the Vdd voltage down even at very high slew rates. When the Vdd voltage returns to nominal values, voltage A is charged up at a controlled slew rate determined by current I_up and the capacitance of capacitor C22. Specifically, the slew rate is I_up/C22. The AC level detect circuit allows fast negative glitches to be detected at node A and, when Vdd goes positive at high slew rates, the AC level detect circuit stretches the time required for voltage A to reach its POR_raw active low state. In this manner, when the Vdd event involves narrow Vdd glitches, the width of the reset signal is widened to ensure sufficient time for the circuitry on the integrated circuit to reset.

The two level detect output signals, voltage A and voltage B, are connected to a window comparator to be compared against a POR threshold voltage Vr. Referring to FIG. 15, window comparator circuit 260 includes a first comparator 262 and a second comparator 264. The POR threshold voltage Vr is coupled to the positive input terminals of first comparator 262 and second comparator 264. Voltage B is coupled to the negative input terminal of first comparator 262 and voltage A is coupled to the negative input terminal of second comparator 264. The output terminals of first and second comparators 262, 264 are coupled to the input terminals of an OR gate 266 for generating the POR_raw signal.

If both voltage A and voltage B are greater than the threshold voltage Vr, the POR_raw signal is deasserted (logical low). That is, when voltage A and voltage B are greater than voltage Vr, output signals A_lo and B_lo are at a logical low and OR gate 266 generates a logical low as the POR_raw signal. If either voltage A or voltage B drops below threshold voltage Vr, then the respective A_lo or B_lo output signal will be asserted and the POR_raw signal will also be asserted accordingly. The POR_raw signal will remain asserted until both voltage A and voltage B are greater than threshold voltage Vr. Effectively, the AC level detect circuit is OR'ed with the DC level detect circuit to provide a combined function that guarantees detection of Vdd events that should validly result in POR detection.

FIG. 16 is a circuit diagram illustrating one implementation of the AC level detect circuit and the DC level detect circuit of the Vdd threshold detector circuit. Referring to FIG. 16, diode D11 is implemented as a diode-connected PMOS transistor M7. The gate and drain terminals of PMOS transistor M7 are connected together and to node B while the source terminal is connected to the Vdd voltage. In AC level detect circuit 254, diode D22 is implemented as a parasitic p-n junction formed by the drain to N-well bulk junction of a PMOS transistor M6. The gate, source and bulk terminals of PMOS transistor M6 are connected to the Vdd voltage. Thus, the transistor is turned off. The drain terminal of transistor M6 is connected to node A. The drain diffusion and the bulk of transistor M6 thus form the parasitic diode D22. In FIG. 16, current sources 256 and 258 providing currents I_dn and I_up are included in a dotted box to indicate that the current sources are representative only and in actual implementation, the currents I_dn and I_up are derived from the self-regulating current source, as will be described in more detail below.

FIG. 17, including FIGS. 17A, 17B, 17C and 17D, contains waveforms illustrating the operation of the Vdd threshold detector circuit of FIG. 15 for a positive going Vdd voltage. FIG. 17D illustrates the Vdd voltage as it rises from 0 volts to 3 volts and the behavior of voltages A and B in response. FIG. 17A illustrates the A_lo signal. FIG. 17B illustrates the B_lo signal. FIG. 17C illustrates the POR_raw signal which is the logical OR of the A_lo and B_lo signals. In a further embodiment of the present invention, reference threshold Vr can be split into two different valued thresholds, VrA and VrB. This allows precise and independent thresholds for the AC and DC Vdd detectors. For example, in FIG. 17, waveforms correspond to approximate values of $V_{rA}$ as 1.5 volts and VrB as 0.8 volts. Having $V_{rB}$ equals to 0.8 volts aligns the DC threshold detect with the Vdd_min voltage, which is the minimum operating voltage of the self regulating current source 104.

As can be seen from FIG. 17D, as the Vdd voltage rises, voltage B follows Vdd but with a diode voltage drop. Meanwhile, voltage A also rises but at a much slower slew rate. This is due to the lower I_up current charging capacitor C22. When voltage B reaches a voltage level of about 0.8 volts, the B_lo signal is deasserted. However, the POR_raw signal remains asserted as the A_lo signal is still asserted. When voltage A reaches a voltage level of 1.5 volts, the A_lo signal is deasserted and the POR_raw signal is also deasserted in response. Thus, the POR_raw signal is asserted until both of the comparator output signals A_lo and B_lo become zero. In the present illustration, voltage A and voltage B are compared against different threshold voltage values as will be described in more detail below with reference to FIG. 19.

Because the AC level detect circuit incorporates an analog pulse stretching technique, voltage A is caused to increase at a slow slew rate, thereby extending the width of the POR_raw pulse well beyond where the DC level detect circuit has reached a non-POR state. In this manner, the POR_raw pulse persists up to and after when the Vdd voltage has reached nominal operating conditions. Note that the stretching of the POR_raw pulse results in the stretching of the final reset signal, as discussed above and illustrated in FIG. 3.

Figure 18A:
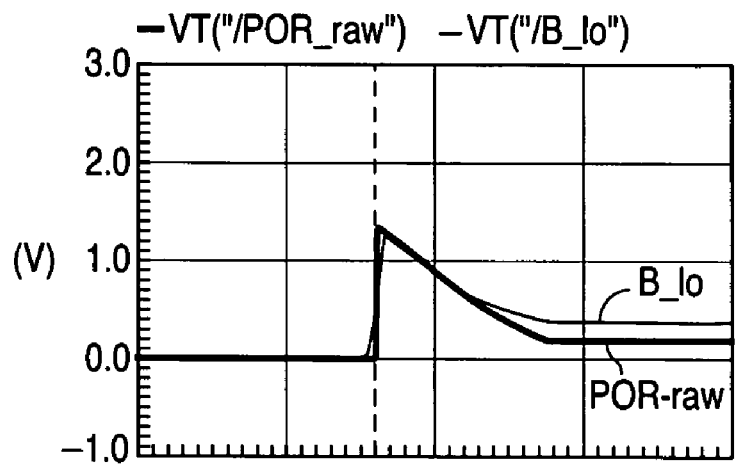
FIG. 18, including FIGS. 18A and 18B, contains waveforms illustrating the operation of the Vdd threshold detect circuit of FIG. 15 for a negative going Vdd voltage.
Figure 18B:
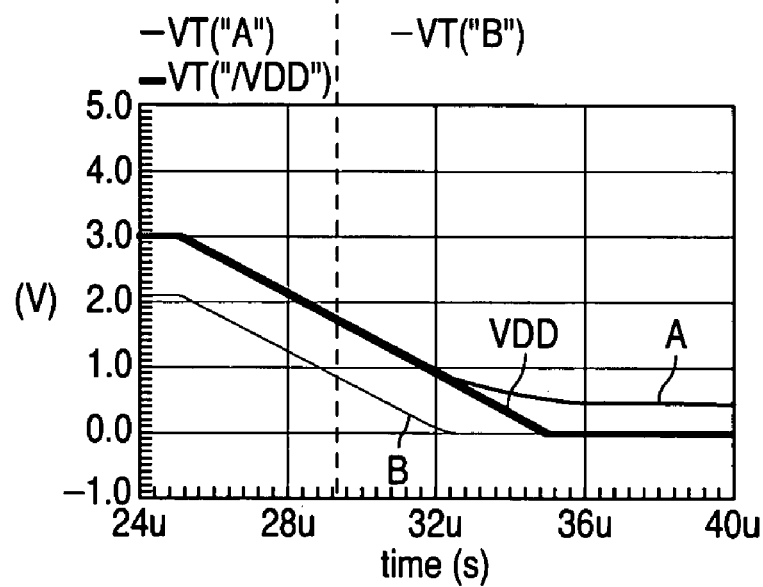

FIG. 18, including FIGS. 18A and 18B, contains waveforms illustrating the operation of the Vdd threshold detector circuit of FIG. 15 for a negative going Vdd voltage. In FIG. 17 above, the operation of the Vdd threshold detector circuit for a positive-going Vdd voltage is illustrated. In the present figure (FIG. 18), the operation of the Vdd threshold detector circuit for a negative-going Vdd voltage is illustrated. The waveforms in FIGS. 17 and 18 illustrate that the Vdd threshold detector of the present invention is capable of generating a valid and useable POR_raw signal (and consequently a valid and useable reset signal) on both the rising and falling edges of Vdd events. The POR circuit of the present invention can thus handle brown-out conditions where the Vdd voltage drops low enough to disrupt the digital and analog circuitry, thereby requiring the circuitry to be reset. When Vdd resumes a nominal value, the functional and parametric performance of the integrated circuit can be assured as the reset signal has been asserted for a sufficient amount of time to enable the digital and analog circuitry of the integrated circuit to reset.

Referring to FIG. 18, FIG. 18B illustrates the Vdd voltage as it decreases from 3 volts to 0 volts and the behavior of voltages A and B in response. FIG. 18A illustrates the B_lo signal and the POR_raw signal. As can be seen from FIG. 18B, as the Vdd voltage decreases, voltages A and B follow the Vdd voltage with voltage B being a diode voltage drop below the Vdd voltage. When the Vdd voltage drops below 1.5 volts and voltage B drops below 0.8 volts, the B_lo signal is asserted and the POR_raw signal is asserted accordingly (FIG. 18A). Note that the voltage magnitude of the B_lo signal and the POR_raw signal decreases as Vdd decreases but their logical state remains valid. The POR_raw signal remains dynamically asserted at 0.4 volts even when Vdd drops to 0 volts. In FIG. 18B, when vdd is at 0 volts, voltage A remains at 0.4 volts until leakage currents very slowly discharge all circuit nodes.

FIG. 19 is a circuit diagram illustrating the coupling of the Vdd threshold detector to the self-regulating current source in the POR circuit according to one embodiment of the present invention. Referring to FIG. 19, Vdd threshold detector 252 and 254 are configured in the same manner as shown in FIG. 16 and self-regulating current source 204 is configured in the same manner as shown in FIG. 6. However, in FIG. 19, current I_dn is coupled to node B by a transistor M71 forming a current mirror with transistor M1 of self-regulating current source 204. In this manner, current $I_L$ is mirrored by transistor M71 as current I_dn. Transistor M71 has the same size as transistor M1, so current I_dn has the same value as current $I_L$. On the other hand, current I_up is coupled to node A by a transistor M61 forming a current mirror with the PMOS filtered current mirror of self-regulating current source 204. Current $I_R$ is then mirrored by transistor M61 as current I_up. Transistor M61 has a size one-fourth of the size of the PMOS transistor in the filtered current mirror to provide current I_up that is only one-fourth of current $I_R$. As current $I_R$ has the same value as current $I_L$, current I_up is then one-fourth of current I_dn.

FIG. 19 also illustrates the coupling of the power supply voltage Vright of the gated ring oscillator to self-regulating current source 204 to provide a boost current to the current source. Finally, an alternate logic circuit for generating the POR_raw signal from voltage A and voltage B is illustrated in FIG. 19. In this embodiment, the window comparator circuit is implemented using inverters. Specifically, voltage B is coupled to a series of two inverters to generate a B_hi signal while voltage A is coupled to an inverter to generate a A_lo signal. As thus configured, the threshold voltage Vr of the window comparator circuit is the logic threshold of the inverter circuits. The implementation of the window comparator circuit in FIG. 19 has advantage over the implementation shown in FIG. 15 as a different threshold voltage can be used for voltage A and voltage B by sizing of the transistors in the inverter circuits, creating effectively threshold voltages $V_{rA}$ and $V_{rB}$, as previously described. When the window comparator circuit is configured as shown in FIG. 19, the B_hi and the inverse of the A_lo signals (A_hi) are coupled to a NAND gate to generate the POR_raw signal. The final reset signal is generated by the logical OR of the POR_raw signal and the RUN signal.

Figure 20:
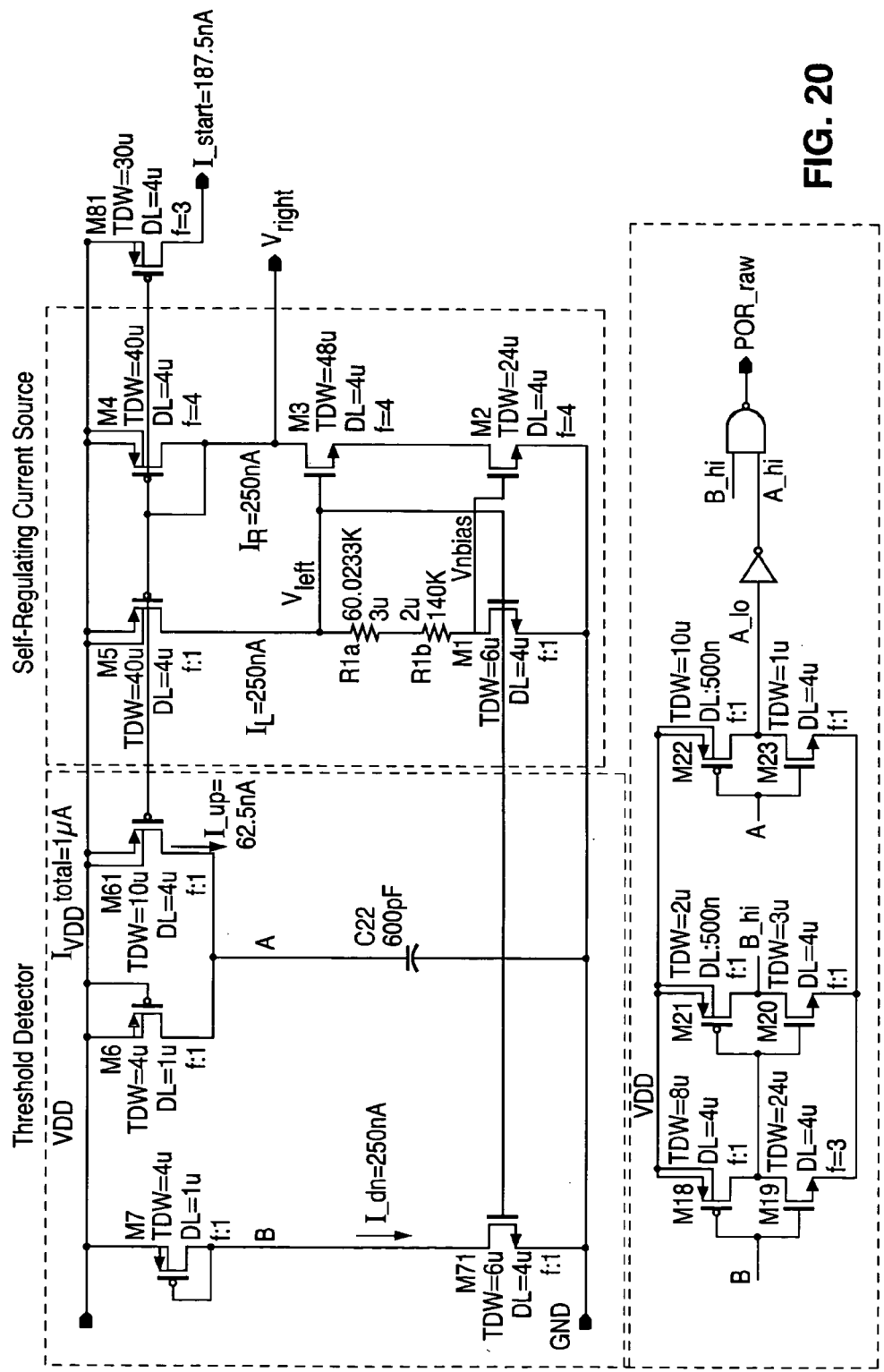
FIG. 20 is a detailed circuit diagram of the Vdd threshold detector and the self-regulating current source of the POR circuit according to one embodiment of the present invention.

FIG. 20 is a detailed circuit diagram of the Vdd threshold detector and the self-regulating current source of the POR circuit according to one embodiment of the present invention. FIG. 20 illustrates the detail construction of the Vdd threshold detector and the self-regulating current source using CMOS transistors.

In the above embodiments, the analog delay introduced between the expiration of an Vdd event and the deassertion of the POR_raw signal is implemented by using a small value charge current I_up to charge capacitor C22. In other embodiments, it is possible to use a current I_up having the same value as current I_dn and a capacitor C22 with large capacitance to realize the desired charging slew rate. Those skilled in the art will realize that many values of I_up and I_dn, and their ratio thereof, can be chosen without altering the basic functionality of the POR circuit. That is, the ratio of currents I_up and I_dn can be less than, greater than or equal to one. As described above, the charging slew rate for the AC level detect circuit is I_up/C22. Thus, either a small I_up current or a large capacitor C22 can be used to provide the desired slew rate value.

DC Biasing Start-up Circuit

Figure 21:
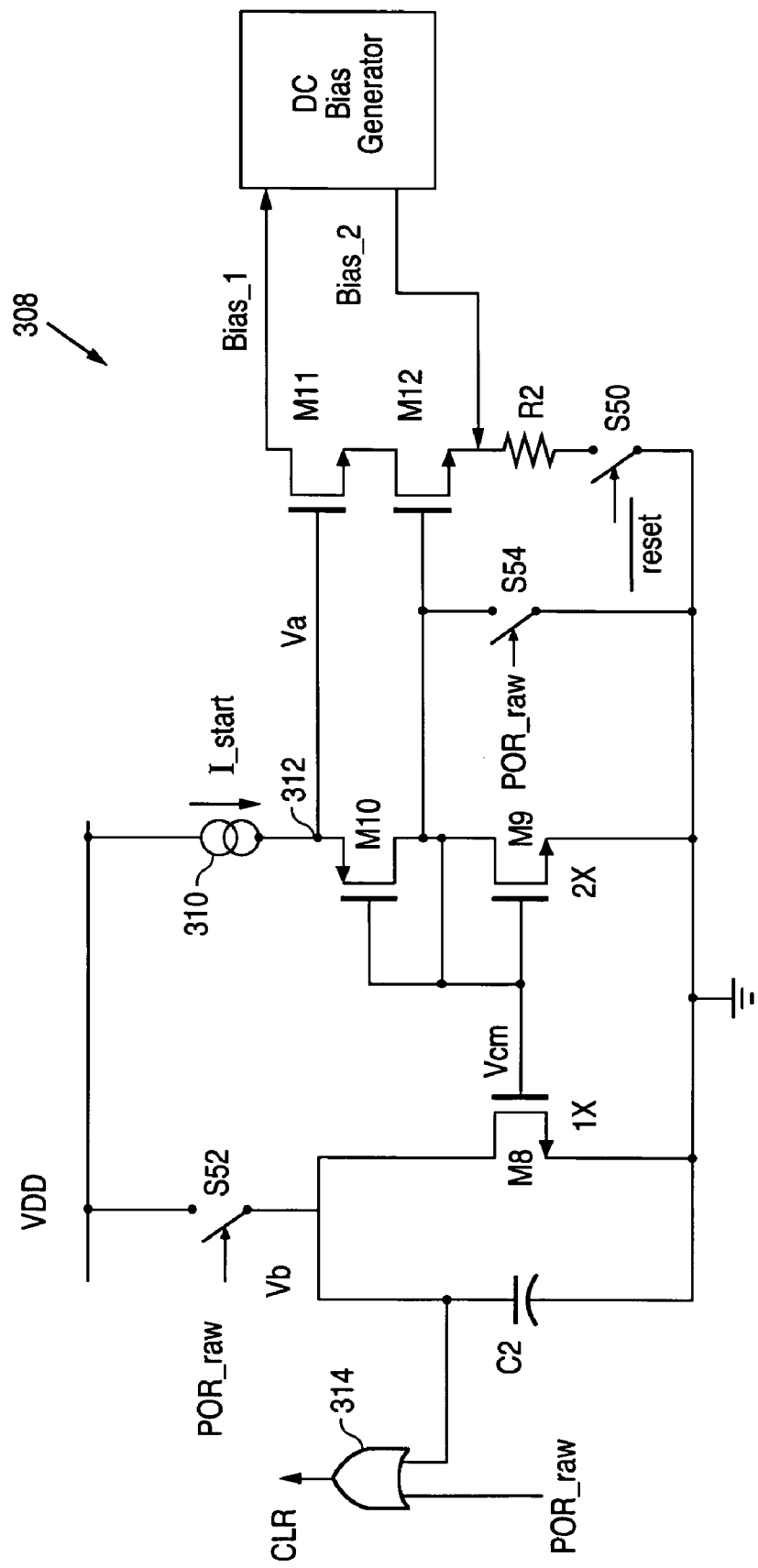
FIG. 21 is a circuit diagram of a DC biasing start-up circuit according to one embodiment of the present invention.

The POR_raw signal generated by the Vdd threshold detector is coupled to a DC biasing start-up circuit. Returning to FIG. 2, DC biasing start-up circuit 108 receives the POR_raw signal, the I_start current, and the reset signal and produces a CLR signal to clear or initialize counter circuit 112. DC biasing start-up circuit 108 also provides start-up currents to DC bias generator 110. FIG. 21 is a circuit diagram of a DC biasing start-up circuit according to one embodiment of the present invention.

Referring to FIG. 21, current I_start is a current externally supplied by the self-regulating current source. Current I_start is represented by a current source 310 coupled between the Vdd power rail and a node 312 which is the source terminal of a PMOS transistor M10. In a non-POR (i.e. normal Vdd) state, current I_start remains on and this current is reflected by NMOS transistors M9 and M8. Transistor M8 provides a discharge path to ground for a voltage Vb. Thus, in a non-POR state, the two input signals (voltage Vb and the POR_raw signal) to an OR gate 314 are at a logical low. OR gate 314 generates the CLR signal. In a non-POR state, the CLR signal is thus deasserted (logical low). Additionally, transistors M9 and M10, biased by current I_start, produce the appropriate bias voltages to the gate terminals of NMOS transistors M11 and M12. In the non-POR state, the reset signal is deasserted and the reset_inverse signal is asserted to close switch S50. Transistor M12 forms a 1 uA current source which is cascoded by transistor M11 to create a bias current Bias_1. Bias current Bias_2 is a feedback current from the DC bias generator circuit 110. In the present embodiment, bias current Bias_1 is a 1 uA current and bias current Bias_2 is also a 1 uA current.

In FIG. 21, transistor M8 is half the size of transistor M9 and thus mirrors one-half of the current I_start. The one-half I_start current is used to discharge a capacitor C2. During a POR event, switch S52 is closed by the assertion of the POR_raw signal and voltage Vb at the top plate of capacitor C2 is charged to the Vdd voltage. When POR_raw is deasserted, capacitor C2 is discharged through transistor M8. When a small current is used to discharge capacitor C2, the discharge time is extended. Because voltage Vb at the top plate of capacitor C2 is used to deassert the CLR signal, the CLR signal will not be deasserted until capacitor C2 is discharged. The extended discharge time thus results in an extended CLR signal. In this manner, a second analog pulse stretching technique is applied in the POR circuit of the present invention to extend the duration of the reset signal As shown in FIG. 3, an extended CLR signal results in the delayed deassertion of the reset signal, thus extending the reset signal persistence.

Bias current Bias_1 is a current used to start-up the DC bias generator circuit. When the DC bias generator circuit is at normal operating conditions, the circuit produces a current Bias_2 which subtracts from the current available for transistor M12's source terminal. The current in transistor M12 is reduced to a few nano-Amperes as a result. However, if DC bias generator circuit is only partially started and operating at lower than normal currents, transistors M12 and M11 instantaneously supply enough Bias_1 current for the DC bias generator circuit to reach full nominal operating current. Thus, a continuously operating feedback loop is always ready to force the DC bias generator circuit into normal operation.

The operation of the DC biasing start-up circuit of FIG. 21 when Vdd starts from zero volts and rises to a nominal voltage (such as 3 volts) is now described. The Vdd threshold detector forces POR_raw to ride up with the Vdd voltage until the POR_raw signal falls to zero. During the interval when POR_raw is asserted, voltage Vb is shorted to Vdd and capacitor C2 is pre-charged to Vdd. There is no current yet in transistor M8 because the gate terminals of transistors M8, M9, M10 and M12 are grounded by a switch S54. There is no current in transistor M11 for the same reason, so current Bias_1 is zero and the DC bias generator circuit is itself in reset.

Once the POR_raw signal goes low (Vdd coming out of POR state), the gate terminals of transistors M8, M9, M10 and M12 reach normal operating potentials. Switch S50 connects the degeneration resistor R2 coupled to the source terminal of transistor M12 to ground. Switch S50 is controlled by the inverse of the reset signal. Thus, when the device is in reset, switch S50 is open. When the device comes out of power-on reset and the reset signal is deasserted, switch S50 is closed. When the reset signal is deasserted, transistor M12, with its degeneration resistor R2, produces a 1 uA current flow through transistor M11 and into the Bias_1 input terminal for the DC bias generator circuit. The Bias_1 current flows continuously until the DC bias generator circuit has fully started up. At that time a similar 1 uA current flows out of the DC bias generator circuit into resistor R2, reducing the current in transistor M12 to the nano-Ampere level. When POR_raw is deasserted, the gate bias of transistor M9, connected to the gate terminal of transistor M8, forces a current in M8 of one half the current I_start which operates to slowly discharge voltage Vb from Vdd to ground. As discussed above, transistor M8's drain current discharges capacitor C2 at a slew rate (V/Sec) of ½*I_start/C2. The discharge slew rate causes an analog delay between when POR_raw goes low and when the second input signal (Vb) to the OR gate 314 goes low enough to deassert the CLR signal. The delay in the deassertion of the CLR signal results in stretching of the pulse width of the reset signal.

The operation of DC biasing start-up circuit 308 can be summarized as follows. When the POR_raw signal and the reset signal are both asserted, capacitor C2 is charged and voltage Vb is equal to voltage Vdd and voltage Vcm is at the ground voltage. The CLR signal is at a logical "high" (asserted) and no start-up current is provided (i.e., current Bias_1 is zero). When the POR_raw signal is deasserted while the reset signal remains asserted, capacitor C2 is not connected to Vdd and voltage Vb is gradually discharged by transistor M8. When voltage Vb is sufficient discharged (drops below the logic level of OR gate 314), the CLR signal starts to transition to a logical "low" state. Still, no start-up current to the DC bias generator is provided. Finally, when both the POR_raw signal and the reset signal are deasserted, voltage Vb is discharged to ground, the CLR signal fully transitions to a logical "low" or deassserted state. Switch S50 is closed and start-up current Bias_1 is provided to start DC bias generator circuit.

DC Bias Generator

Figure 22:
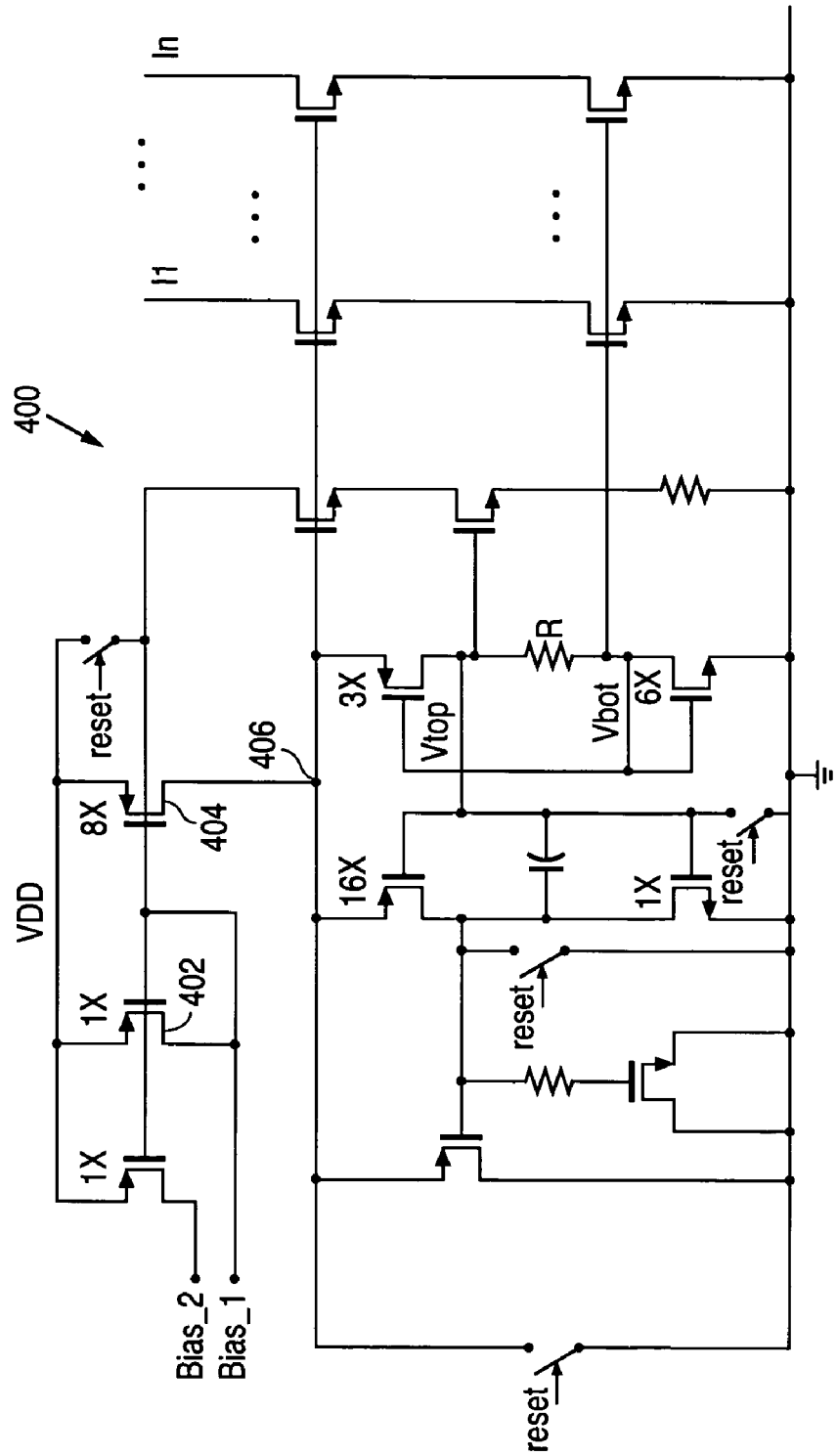
FIG. 22 is a circuit diagram of a DC bias generator circuit which can be incorporated in the POR circuit according to one embodiment of the present invention.

FIG. 22 is a circuit diagram of a DC bias generator circuit which can be incorporated in the POR circuit according to one embodiment of the present invention. DC bias generator 400 receives start-up current Bias_1 from the DC biasing start-up circuit and provides a feedback current Bias_2.

DC bias generator circuit 400 of FIG. 22 requires a minimum current, shown as current Bias_1, to start up reliably. Bias_1 current is multiplied by the PMOS current mirror formed by PMOS transistors 402 and 404 having an 8:1 multiplication factor. The multiplied current is fed into the core of the DC Bias Generator Circuit (node 406) where a fraction of this current is reflected back into the PMOS current mirror of transistors 402 and 404. At some point, this additional current will create a positive loop gain between the core of the DC bias generator circuit and the feedback loop formed by the input and output from the PMOS current mirror. When this positive loop gain exceeds unity, the DC bias generator circuit will regenerate and increase its operating current until a separate mechanism sets a stable fixed operating point by reducing the loop gain with increases in operating current, ultimately until the loop gain drops to or below unity.

In the present embodiment, the minimum current required to guarantee reliable startup of DC bias generator circuit 400 is well below 1 uA. Therefore, by choosing a current of 1 uA for current Bias_1, DC bias generator circuit 400 will always start. Once circuit 400 reaches its equilibrium point, it generates feedback current Bias_2. The feedback current is also chosen to be 1 uA. As current Bias_2 increases towards 1 uA itself, it feeds back to the source terminal of transistor M12 in the DC biasing start-up circuit (FIG. 21). This current, Bias_2, reduces the current that had been flowing through NMOS transistors M12 and M11 that produces the aforementioned output current Bias_1 and it supplants or replaces the current previously flowing through resistor R2. Because of the non-linearity of transistor M12's Vgs as a function of the drain-to-source current Ids, current Bias_1 never reduces to exactly zero, instead falls to a standby level of several nano-Amperes. Since transistors M12 and M11 are always active, any reduction in the DC bias generator circuit's normal operating current will reduce current Bias_2 and increase currentBias_1. In fact, the sum of currents Bias_1 and Bias_2 tends to be constant at the design value of 1 uA. In this way, the DC bias generator circuit is constantly being monitored and its operating point is restored for any perturbation.

In the present embodiment, the core of DC bias generator 400 is a precision constant temperature coefficient current source with high power supply rejection ratio (PSRR). A precision current source with high PSRR is described in copending and commonly assigned U.S. patent application Ser. No. 10/402,447, entitled "A Constant Temperature Coefficient Self-Regulating CMOS Current Source," of Peter R. Holloway et al., filed Mar. 27, 2003, which patent application is incorporated herein by reference in its entirety. Construction and operation of the precision constant temperature coefficient current source is described in detail in the '447 patent application and will not be repeated here.

In FIG. 22, one or more current mirrors can be added to generate bias currents I1 to In as needed for biasing the internal circuitry of the integrated circuit.

It is instructive to note that the DC bias generator is not part of the POR circuit of the present invention but rather is a circuit driven by the start-up currents and the reset signals generated by the POR circuit. The DC bias generator is included in FIG. 2 to illustrate the incorporation of the POR circuit in an integrated circuit for providing the necessary bias currents. In other implementations, the POR circuit of the present invention can be coupled to other circuit blocks when the start-up currents and the reset signal are used to realize a power-on reset operation for the integrated circuit.

POR Circuit Operation Waveforms

FIG. 23, including FIGS. 23A to 23F, contains waveforms illustrating the operation of the POR circuit of the present invention when different Vdd vectors are being presented to the POR circuit. The waveforms in FIG. 23 are generated from simulation of the circuit blocks and the voltage magnitudes are therefore of scale. As can be seen in FIG. 23, even when the Vdd voltage is at 0 volts, the CLR and POR_raw signals remain valid for an extended period of time until ultimately discharged by leakage currents. Thus, for a new Vdd vector occurring within this leakage decay time, these logic signals remain asserted. Also demonstrated in FIG. 23 is the delay between the deassertion of the POR_raw signal and the CLR signal and the delay from the deassertion of the CLR signal to the deassertion of the reset signal. For vastly separated Vdd events, the POR circuit works in the same manner described hereto from zero Vdd to normal Vdd operation.

FIG. 24, including FIGS. 24A to 24G, contains waveforms illustrating the operation of the POR circuit of the present invention when Vdd rises to 3V at a typical process corner and a temperature of 25° C. FIG. 25, including FIGS. 25A to 25G, contains waveforms illustrating the operation of the POR circuit of the present invention when Vdd rises to 2.4V at a slow process corner and a temperature of −50° C. FIG. 26, including FIGS. 26A to 26G, contains waveforms illustrating the operation of the POR circuit of the present invention when Vdd rises to 5V at a fast process corner and a temperature of −50° C.

As can be observed from the waveforms in FIGS. 24–26, the oscillation rate of the gated ring oscillator circuit is self-adjusting as a function of the Vdd voltage and temperature and processing conditions. At a slow process corner, the oscillator circuit runs slowly and the digital pulse delay Td is very long. However at a fast process corner, the oscillator circuit runs faster and the digital pulse delay Td becomes shorter.

In the above descriptions, the label "Vdd" has been used to refer to the power supply voltage of the integrated circuit in which the power-on reset circuit is incorporated. The reference to "Vdd" as the power supply voltage is illustrative only and one of ordinary skill in the art would appreciate that the power-on reset circuit of the present invention can be used to monitor the condition of any power supply voltage of an integrated circuit.

The above detailed descriptions are provided to illustrate specific embodiments of the present invention and are not intended to be limiting. Numerous modifications and variations within the scope of the present invention are possible. The present invention is defined by the appended claims.

We claim:

1. A self-regulating current source comprising:
   a current mirror coupled to the positive power supply voltage and comprising a first current output terminal and a second current output terminal;
   a first NMOS transistor having a control terminal coupled to the first current output terminal of the current mirror, a first current handling terminal coupled to a first node and a second current handling terminal coupled to a negative power supply voltage;
   a second NMOS transistor having a control terminal coupled to the first node, a first current handling terminal coupled to a second node and a second current handling terminal coupled to the negative power supply voltage, the first NMOS transistor and the second NMOS transistor being of unequal sizes;
   a third NMOS transistor having a control terminal coupled to the first current output terminal of the current mirror, a first current handling terminal coupled to the second current output terminal of the current mirror and a second current handling terminal coupled to the second node; and
   a first resistor coupled between the first current output terminal of the current mirror and the first node,
   wherein a first regulated current is provided at the first current output terminal of the current mirror and a second regulated current is provided at the second current output terminal of the current mirror, the plurality of output currents being derived from and proportional to the first or second regulated current.

2. The self-regulating current source of claim 1, wherein the current mirror comprises a PMOS current mirror.

3. The self-regulating current source of claim 2, wherein the PMOS current mirror comprises:
   a first PMOS transistor having a control terminal coupled to the second current output terminal, a first current handling terminal being the first current output terminal, and a second current handling terminal coupled to the positive power supply voltage; and
   a second PMOS transistor having a control terminal coupled to the second current output terminal, a first current handling terminal being the second current output terminal, and a second current handling terminal coupled to the positive power supply voltage.

4. The self-regulating current source of claim 3, further comprising one or more PMOS transistors each having a control terminal, a first current handling terminal, and a second current handling terminal, the control terminal being coupled to the control terminal of the first or second PMOS transistor and the second current handling terminal coupled to the power supply voltage, the one or more PMOS transistors forming current mirrors to generate the plurality of output currents at the first current handling terminals of the one or more PMOS transistors.

5. The self-regulating current source of claim 1, wherein the size of the second NMOS transistor is larger than the size of the first NMOS transistor.

6. The self-regulating current source of claim 1, wherein a voltage across the first resistor comprises a voltage difference of the gate-to-source voltage of the first NMOS transistor and the gate-to-source voltage of the second NMOS transistor.

7. The self-regulating current source of claim 1, wherein a boost current is supplied to the second current output terminal of the current mirror to start-up the self-regulating current source.

8. The self-regulating current source of claim 7, wherein the boost current is supplied by a power supply voltage of a ring oscillator.

9. The self-regulating current source of claim 1, wherein the plurality of output currents are provided continuously when the positive power supply voltage of the integrated circuit is greater than a first minimum voltage value.

10. The self-regulating current source of claim 1, further comprising one or more NMOS transistors each having a control terminal, a first current handling terminal, and a second current handling terminal, the control terminal being coupled to the control terminal of the first or second NMOS transistor and the second current handling terminal coupled to the negative power supply voltage, the one or more NMOS transistors forming current mirrors to generate the plurality of output currents at the first current handling terminals of the one or more NMOS transistors.

* * * * *